US012562708B2

(12) United States Patent (10) Patent No.: US 12,562,708 B2
Isozaki et al. (45) Date of Patent: Feb. 24, 2026

(54) VIBRATOR DEVICE

(71) Applicant: SEIKO EPSON CORPORATION, Tokyo (JP)

(72) Inventors: Shigenori Isozaki, Minowa-machi (JP); Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 771 days.

(21) Appl. No.: 17/988,167

(22) Filed: Nov. 16, 2022

(65) Prior Publication Data

US 2023/0155567 A1 May 18, 2023

(30) Foreign Application Priority Data

Nov. 18, 2021 (JP) ................................. 2021-187667

(51) Int. Cl.
| | |
|---|---|
| *H03H 9/02* | (2006.01) |
| *H03B 5/32* | (2006.01) |
| *H03H 9/05* | (2006.01) |
| *H03H 9/10* | (2006.01) |
| *H03H 9/19* | (2006.01) |

(52) U.S. Cl.
CPC ...... *H03H 9/02125* (2013.01); *H03H 9/0533* (2013.01); *H03H 9/0547* (2013.01); *H03H 9/1021* (2013.01); *H03H 9/19* (2013.01); *H03B 5/32* (2013.01)

(58) Field of Classification Search
CPC ............. H03H 9/02125; H03H 9/0533; H03H 9/0547; H03H 9/1021; H03H 9/19; H03H 9/0538; H03H 9/13; H03B 5/32
See application file for complete search history.

(56) References Cited

U.S. PATENT DOCUMENTS

| | | | | |
|---|---|---|---|---|
| 10,320,396 B2 * | 6/2019 | Isohata | ............... | H03H 9/1021 |
| 10,511,259 B2 * | 12/2019 | Obata | .................... | H10N 30/02 |
| 10,530,299 B2 * | 1/2020 | Kikuchi | ................... | H03H 3/02 |
| 10,644,704 B2 * | 5/2020 | Isohata | ............... | H03H 9/0552 |
| 10,734,969 B2 * | 8/2020 | Ito | .......................... | H03H 9/145 |
| 11,009,351 B2 * | 5/2021 | Shimura | ............... | H10N 30/87 |
| 11,196,406 B2 * | 12/2021 | Shimura | ................. | H03H 9/19 |
| 11,290,081 B2 * | 3/2022 | Aoki | ..................... | H03H 9/0538 |
| 11,431,343 B2 * | 8/2022 | Kasahara | ................. | H03B 5/32 |
| 11,569,795 B2 * | 1/2023 | Matsuo | .................... | H03H 9/17 |
| 11,990,887 B2 * | 5/2024 | Nishizawa | ............... | H03H 9/19 |
| 12,438,478 B2 * | 10/2025 | Ueta | ..................... | H10N 30/88 |

(Continued)

FOREIGN PATENT DOCUMENTS

| | | |
|---|---|---|
| CN | 108631743 A | 10/2018 |
| CN | 111614339 A | 9/2020 |

(Continued)

*Primary Examiner* — Pedro J Cuevas

(74) *Attorney, Agent, or Firm* — Rankin, Hill & Clark LLP

(57) ABSTRACT

A vibrator device has a base, a semiconductor element having an oscillation circuit, and a vibrator having an excitation electrode sequentially stacked and includes a first wire electrically coupling between the excitation electrode and the semiconductor element, a second wire electrically coupling between a second external terminal as an external output terminal placed on the base and the semiconductor element, and a shield wire placed between at least a part of the first wire and at least a part of the second wire.

10 Claims, 15 Drawing Sheets

(56)        References Cited

U.S. PATENT DOCUMENTS

| | | | | |
|---|---|---|---|---|
| 2015/0123742 | A1* | 5/2015 | Naito | H10N 30/88 |
| | | | | 331/158 |
| 2016/0116286 | A1 | 4/2016 | Nishizawa et al. | |
| 2016/0285461 | A1* | 9/2016 | Okubo | H03L 1/00 |
| 2017/0230003 | A1* | 8/2017 | Kikuchi | H03H 9/13 |
| 2018/0265349 | A1* | 9/2018 | Ito | H03H 9/19 |
| 2018/0269832 | A1* | 9/2018 | Obata | H03L 1/028 |
| 2018/0269834 | A1* | 9/2018 | Ito | H03B 5/32 |
| 2018/0269850 | A1 | 9/2018 | Ito | |
| 2019/0165760 | A1* | 5/2019 | Shimura | H03H 9/19 |
| 2019/0195630 | A1* | 6/2019 | Shimura | H03H 3/04 |
| 2019/0222215 | A1* | 7/2019 | Isohata | H03H 9/0552 |
| 2020/0252050 | A1* | 8/2020 | Matsuo | H03H 9/10 |
| 2020/0274486 | A1 | 8/2020 | Aoki et al. | |
| 2021/0297062 | A1 | 9/2021 | Mizuguchi | |
| 2021/0336600 | A1* | 10/2021 | Nishizawa | H03H 9/1021 |
| 2021/0376840 | A1* | 12/2021 | Kasahara | H03B 5/32 |
| 2023/0155568 | A1* | 5/2023 | Aoki | H03H 9/19 |
| | | | | 310/314 |
| 2023/0163702 | A1* | 5/2023 | Ueta | H02N 2/005 |
| | | | | 310/314 |
| 2024/0014798 | A1* | 1/2024 | Fujinami | H03H 9/1021 |
| 2025/0070748 | A1* | 2/2025 | Ota | G01K 7/183 |

FOREIGN PATENT DOCUMENTS

| | | | | | |
|---|---|---|---|---|---|
| CN | 113411060 | A | | 9/2021 | |
| CN | 109690940 | B | * | 3/2023 | H03H 3/02 |
| CN | 116137519 | A | * | 5/2023 | H03H 9/19 |
| CN | 109842396 | B | * | 1/2024 | H03H 9/19 |
| CN | 117650764 | A | * | 3/2024 | H03H 9/19 |
| JP | 2004-193965 | A | | 7/2004 | |
| JP | 2006-67552 | A | | 3/2006 | |
| JP | 2013-179504 | A | | 9/2013 | |
| JP | 2017139682 | A | * | 8/2017 | H03H 3/02 |
| JP | 6946679 | B2 | * | 10/2021 | H03H 9/0514 |
| JP | 2023074646 | A | * | 5/2023 | H03H 9/1021 |
| JP | 7331376 | B2 | * | 8/2023 | H03H 9/10 |
| WO | WO-2022201752 | A1 | * | 9/2022 | H01L 23/02 |

* cited by examiner

VIBRATOR DEVICE

The present application is based on, and claims priority from JP Application Serial Number 2021-187667, filed Nov. 18, 2021, the disclosure of which is hereby incorporated by reference herein in its entirety.

BACKGROUND

1. Technical Field

The present disclosure relates to a vibrator device.

2. Related Art

In related art, as shown in JP-A-2006-67552, a piezoelectric oscillator (vibrator device) in which a piezoelectric vibrator and an IC chip as a circuit for oscillating the piezoelectric vibrator are placed in upward and downward directions of a substrate is known. The piezoelectric vibrator, the IC chip, and the substrate are placed as described above, and thereby, the piezoelectric oscillator may be downsized.

However, in the piezoelectric oscillator disclosed in JP-A-2006-67552, distances between a pair of wires for electrically coupling the piezoelectric vibrator and the IC chip and oscillating the piezoelectric vibrator and a wire for electrically coupling a mounted terminal of the piezoelectric oscillator and the IC chip and outputting an output signal such as a clock signal are smaller. Accordingly, parasitic capacitances produced between the pair of wires for oscillating the piezoelectric vibrator and the wire for outputting the output signal increase. With the increase of the parasitic capacitances, the difference between the parasitic capacitance between one wire of the pair of wires for oscillating the piezoelectric vibrator and the wire for outputting the output signal and the parasitic capacitance between the other wire of the pair of wires for oscillating the piezoelectric vibrator and the wire for outputting the output signal increases. There is a problem that, when the difference in parasitic capacitance increases, frequency-power characteristics of the piezoelectric oscillator are deteriorated.

Note that the frequency-power characteristics refer to fluctuations of the output frequency relative to fluctuations of the power supply voltage, and the deterioration of the frequency-power characteristics means that the fluctuations of the output frequency relative to the fluctuations of the power supply voltage are larger.

SUMMARY

A vibrator device is a vibrator device having a base, a semiconductor element having an oscillation circuit, and a vibrator having an excitation electrode sequentially stacked and including a first wire electrically coupling between the excitation electrode and the semiconductor element, a second wire electrically coupling between an external output terminal placed on the base and the semiconductor element, and a shield wire placed between at least a part of the first wire and at least a part of the second wire.

BRIEF DESCRIPTION OF THE DRAWINGS

FIG. 6 is a sectional view of a vibrator device according to embodiment 2.

DESCRIPTION OF EXEMPLARY EMBODIMENTS

Figure 1:
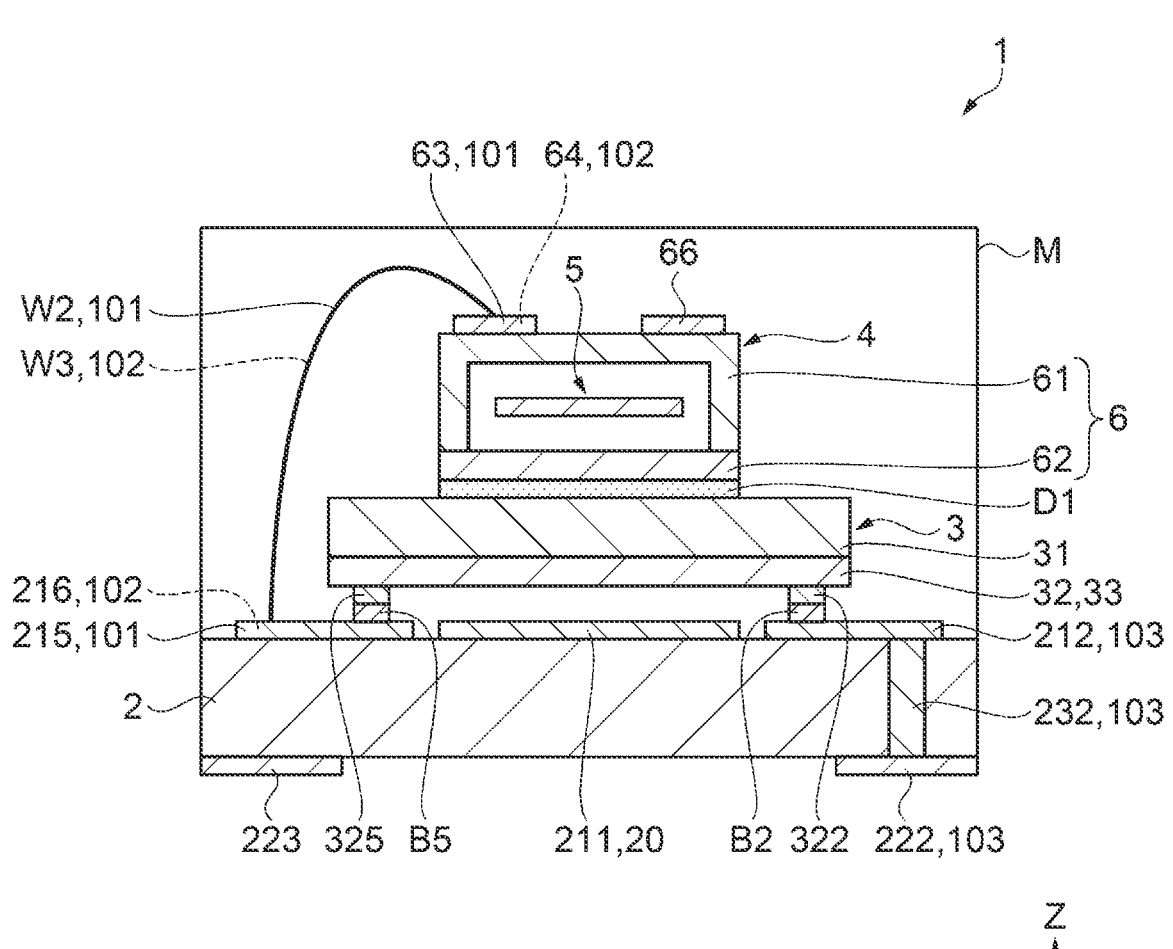
FIG. 1 is a sectional view of a vibrator device according to embodiment 1.
Figure 1:
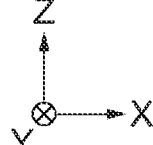

Next, referring to the drawings, embodiments of the present disclosure will be explained.

For convenience of explanation, the following respective drawings show an X-axis, a Y-axis, and a Z-axis as three axes orthogonal to one another. Directions along the X-axis are referred to as "X directions", directions along the Y-axis are referred to as "Y directions", and directions along the Z-axis are referred to as "Z directions". Further, head sides of arrows in the respective axial directions are referred to as "plus sides" and tail sides of the arrows are referred to as "minus sides". For example, the Y directions refer to both directions toward the plus side in the Y direction and the minus side in the Y direction. Furthermore, the plus side in the Z direction is also referred to as "upper" and the minus side in the Z direction is also referred to as "lower". A plan view from the Z direction is also simply referred to as "plan view".

1. Embodiment 1

A vibrator device 1 according to embodiment 1 will be explained with reference to FIGS. 1 to 5. In the embodiment, the vibrator device 1 is an oscillator. Note that the vibrator device 1 is not necessarily the oscillator. For example, the vibrator device 1 may be an inertial sensor.

Figure 2:
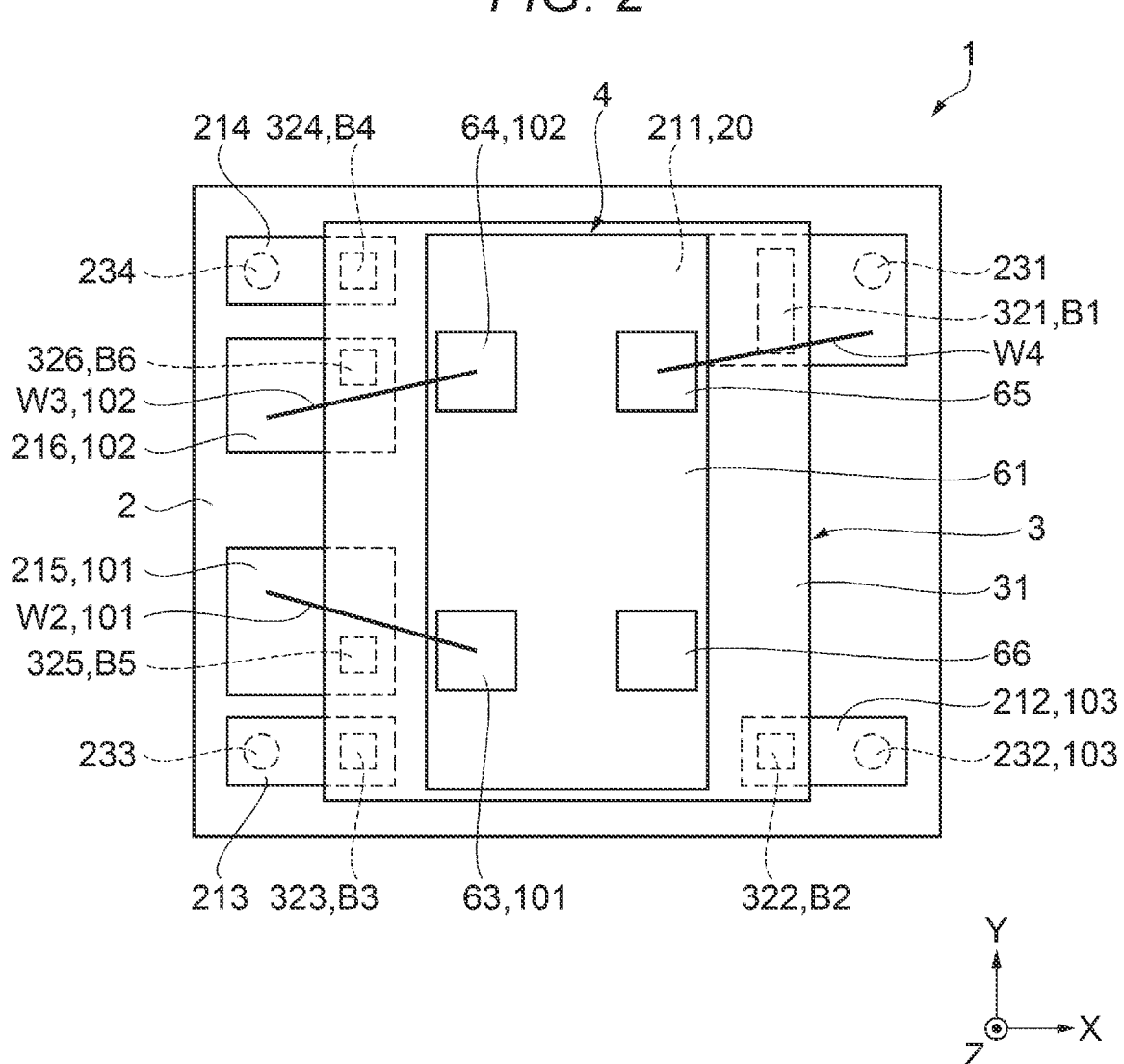
FIG. 2 is a plan view of the vibrator device according to embodiment 1.

As shown in FIGS. 1 and 2, the vibrator device 1 has the base 2, the semiconductor element 3, and the vibrator 4. The base 2, the semiconductor element 3, and the vibrator 4 are sequentially stacked along the Z directions as upward and downward directions. In the embodiment, the semiconductor element 3 is placed on an upper surface of the base 2 and the vibrator 4 is placed on an upper surface of the semiconductor element 3. A mold portion M is provided at an upper surface side of the base 2 to seal the semiconductor element 3 and the vibrator 4. Note that, in FIG. 2, the mold portion M is omitted for convenience of explanation.

The respective units of the vibrator device 1 including the semiconductor element 3 and the vibrator 4 may be protected from water, dust, impact, etc. by the mold portion M. The material forming the mold portion M is not particularly limited. As the material forming the mold portion M, e.g. a thermosetting resin such as epoxy resin may be used. The mold portion M may be formed using e.g. compression molding. Note that the mold portion M is used in the embodiment, however, the semiconductor element 3 and the vibrator 4 may be sealed by bonding of a lid member having a recessed portion that can house the semiconductor element 3 and the vibrator 4 to the upper surface of the base 2.

First, the base 2 will be explained.

In the embodiment, the base 2 is in a plate shape. The base 2 has the upper surface as a surface facing the semiconductor element 3 in the base 2, the lower surface having a front-back relation to the upper surface of the base 2, and a side surface coupling the upper surface and the lower surface of the base 2. The material forming the base 2 is not particularly limited. For example, a ceramic substrate or the like may be used as the base 2.

Figure 3:
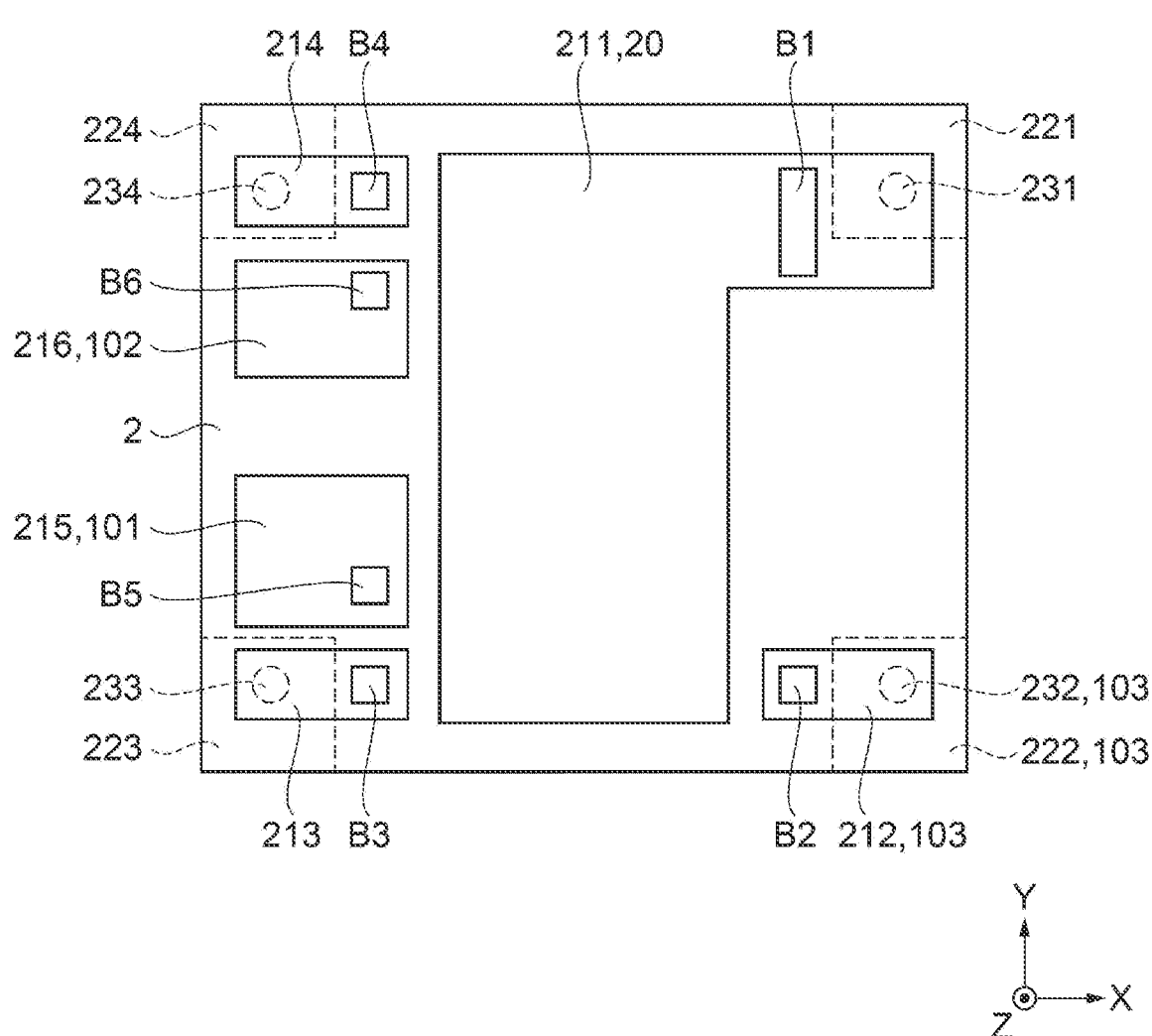
FIG. 3 is a plan view of a base according to embodiment 1.

As shown in FIGS. 1 and 3, on the lower surface of the base 2, a first external terminal 221, a second external terminal 222, a third external terminal 223, and a fourth external terminal 224 are placed. The first external terminal 221, the second external terminal 222, the third external terminal 223, and the fourth external terminal 224 are external terminals for electrically coupling the vibrator device 1 to the outside.

The first external terminal 221 is placed in a corner at the plus side in the X direction and the plus side in the Y direction on the lower surface of the base 2. The second external terminal 222 is placed in a corner at the plus side in the X direction and the minus side in the Y direction on the lower surface of the base 2. The third external terminal 223 is placed in a corner at the minus side in the X direction and the minus side in the Y direction on the lower surface of the base 2. The fourth external terminal 224 is placed in a corner at the minus side in the X direction and the plus side in the Y direction on the lower surface of the base 2.

The first external terminal 221 is a ground terminal for coupling to a ground potential. The ground potential in the present disclosure refers to a reference potential having a fixed potential. The second external terminal 222 is an external output terminal for outputting a reference signal such as a clock signal. The third external terminal 223 is a power supply terminal for coupling to a power supply. The fourth external terminal 224 is an output enable terminal for controlling the output from the second external terminal 222 as an external output terminal.

Further, in the base 2, a plurality of vias 231, 232, 233, 234 penetrating between the upper surface and the lower surface of the base 2 are provided. The vias 231, 232, 233, 234 are respectively through electrodes formed by filling of through holes penetrating the base 2 with conductors. The via 231, the via 232, the via 233, and the via 234 are placed to overlap with the first external terminal 221, the second external terminal 222, the third external terminal 223, and the fourth external terminal 224 in the plan view, respectively.

As shown in FIGS. 2 and 3, on the upper surface of the base 2, a first coupling wire 211, a second coupling wire 212, a third coupling wire 213, a fourth coupling wire 214, a fifth coupling wire 215, and a sixth coupling wire 216 respectively electrically coupled to the semiconductor element 3 are placed.

The first coupling wire 211 is placed to overlap with the via 231 in the plan view. The first coupling wire 211 and the first external terminal 221 are electrically coupled via the via

231. That is, the first coupling wire 211 is electrically coupled to the ground potential via the first external terminal 221 as the ground terminal and the via 231. Note that the first coupling wire 211 may function as a shield wire 20 as will be described later.

The second coupling wire 212 is placed to overlap with the via 232 in the plan view. Further, the second coupling wire 212 and the second external terminal 222 are electrically coupled via the via 232.

The third coupling wire 213 is placed to overlap with the via 233 in the plan view. Further, the third coupling wire 213 and the third external terminal 223 are electrically coupled via the via 233. A part of the fourth coupling wire 214 is placed to overlap with the fourth external terminal 224 and the via 234 in the plan view. Further, the fourth coupling wire 214 and the fourth external terminal 224 are electrically coupled via the via 234.

The fifth coupling wire 215 and the sixth coupling wire 216 are placed between the third coupling wire 213 and the fourth coupling wire 214 on the upper surface of the base 2. The third coupling wire 213, the fifth coupling wire 215, the sixth coupling wire 216, and the fourth coupling wire 214 are sequentially placed toward the plus side in the Y direction.

Further, the fifth coupling wire 215 and sixth coupling wire 216 and the second coupling wire 212 are placed with the vibrator 4 in between in the plan view. Specifically, the fifth coupling wire 215 and sixth coupling wire 216 forming parts of first wires 101, 102 are placed at the minus side in the X direction as one side of the vibrator 4 in the plan view. The second coupling wire 212 forming a part of a second wire 103 is placed at the plus side in the X direction as the other side of the vibrator 4 in the plan view. Note that the first wires 101, 102 and the second wire 103 will be described later.

Next, the semiconductor element 3 will be explained.

As shown in FIG. 1, the semiconductor element 3 has a semiconductor substrate 31 and a circuit unit 32. In the embodiment, the circuit unit 32 is placed on a lower surface of the semiconductor substrate 31. That is, the upper surface of the semiconductor element 3 is an upper surface of the semiconductor substrate 31 and the lower surface of the semiconductor element 3 is a lower surface of the circuit unit 32.

The semiconductor substrate 31 is in a plate shape. The material forming the semiconductor substrate 31 is not particularly limited. For example, silicon, germanium, silicon germanium, or the like may be used as the semiconductor substrate 31.

The circuit unit 32 is an integrated circuit in which active elements including a plurality of transistors (not shown) are electrically coupled by wires (not shown). The circuit unit 32 has an oscillation circuit 33 generating the frequency of the reference signal such as a clock signal by oscillating a vibrator element 5 of the vibrator 4. Note that the circuit unit 32 may have a temperature compensated circuit correcting the vibration characteristics of the vibrator element 5 according to temperature changes, a processing circuit processing an output signal from the oscillation circuit 33, an electrostatic protection circuit, or the like in addition to the oscillation circuit 33.

As shown in FIGS. 1 and 2, on the lower surface of the semiconductor element 3, a first coupling terminal 321, the second coupling terminal 322, a third coupling terminal 323, a fourth coupling terminal 324, a fifth coupling terminal 325, and a sixth coupling terminal 326 are placed. The first coupling terminal 321, the second coupling terminal 322, the third coupling terminal 323, the fourth coupling terminal 324, the fifth coupling terminal 325, and the sixth coupling terminal 326 are electrically coupled to the circuit unit 32 by wires (not shown).

The fifth coupling terminal 325 and sixth coupling terminal 326 and the second coupling terminal 322 are placed with the vibrator 4 in between in the plan view. Specifically, the fifth coupling terminal 325 and sixth coupling terminal 326 are placed at the minus side in the X direction as one side of the vibrator 4 in the plan view. The second coupling terminal 322 is placed at the plus side in the X direction as the other side of the vibrator 4 in the plan view.

The first coupling terminal 321 is a ground terminal for coupling to a ground potential. The second coupling terminal 322 is a reference signal output terminal for outputting the reference signal such as a clock signal. The third coupling terminal 323 is a power supply terminal for coupling to a power supply. The fourth coupling terminal 324 is an output enable terminal for controlling the output from the second coupling terminal 322 as the reference signal output terminal. The fifth coupling terminal 325 and the sixth coupling terminal 326 are drive signal output terminals for outputting drive signals that oscillate the vibrator 4. The vibrator 4 oscillates according to the drive signals output from the fifth coupling terminal 325 and the sixth coupling terminal 326.

Further, bumps B1, B2, B3, B4, B5, B6 are placed between the base 2 and the semiconductor element 3. The base 2 and the semiconductor element 3 are bonded via the bumps B1, B2, B3, B4, B5, B6. That is, the semiconductor element 3 is mounted on the upper surface of the base 2 via the bumps B1, B2, B3, B4, B5, B6 using flip-chip bonding. The bumps B1, B2, B3, B4, B5, B6 are not particularly limited as long as the bumps have conductivity and bondability. For example, gold bumps, silver bumps, copper bumps, solder bumps, or the like may be used.

Specifically, for example, the bump B1 is placed to overlap with the first coupling wire 211 placed on the upper surface of the base 2 and the first coupling terminal 321 placed on the lower surface of the semiconductor element 3 in the plan view. In this manner, the first coupling terminal 321 and the first coupling wire 211 are electrically coupled via the bump B1.

Similarly, the second coupling terminal 322 and the second coupling wire 212 are electrically coupled via the bump B2. The third coupling terminal 323 and the third coupling wire 213 are electrically coupled via the bump B3. The fourth coupling terminal 324 and the fourth coupling wire 214 are electrically coupled via the bump B4. The fifth coupling terminal 325 and the fifth coupling wire 215 are electrically coupled via the bump B5. The sixth coupling terminal 326 and the sixth coupling wire 216 are electrically coupled via the bump B6. Note that the bumps B1, B2, B3, B4, B5, B6 may be provided on any one of the base 2 and the semiconductor element 3.

The vibrator 4 is placed on the upper surface of the semiconductor element 3. The semiconductor element 3 and the vibrator 4 are bonded via an adhesive D1.

Next, the vibrator 4 will be explained.

Figure 4:
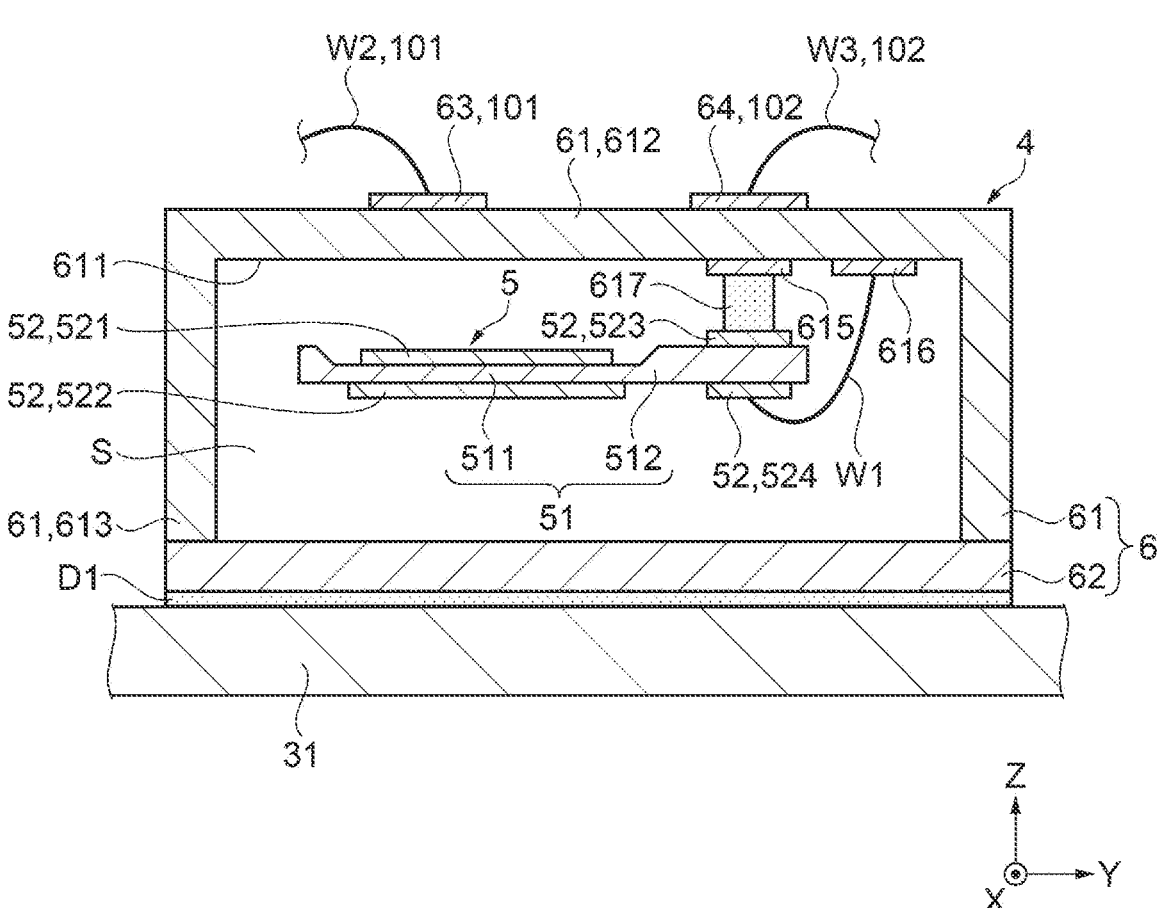
FIG. 4 is a sectional view of a vibrator according to embodiment 1.

As shown in FIGS. 1 and 4, the vibrator 4 has the vibrator element 5 and a package 6 housing the vibrator element 5.

First, the vibrator element 5 will be explained.

Figure 5:
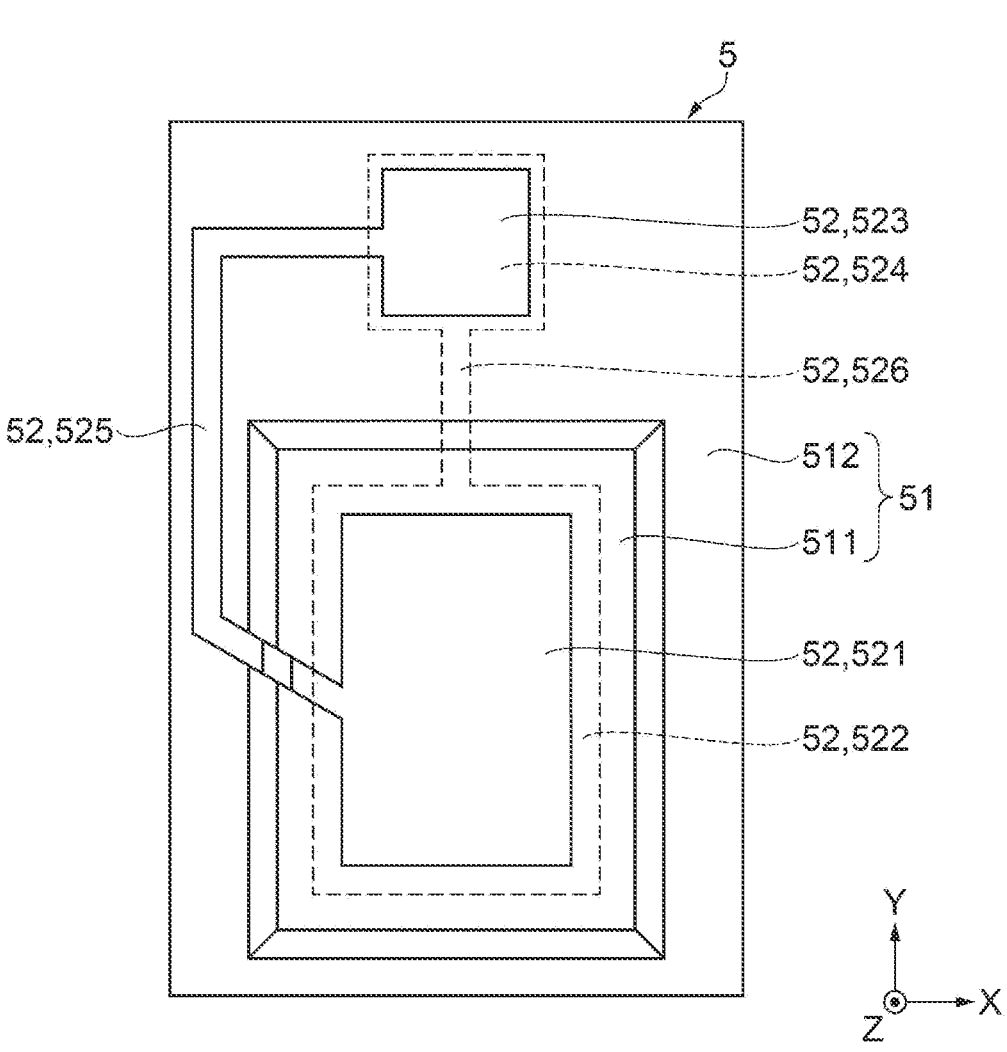
FIG. 5 is a plan view of a vibrator element according to embodiment 1.

As shown in FIGS. 4 and 5, the vibrator element 5 has a vibrator substrate 51 and electrodes 52 placed on surfaces of the vibrator substrate 51.

The vibrator substrate 51 is in a plate shape. The vibrator substrate 51 has a thin vibrating portion 511 and a thick portion 512 located around the vibrating portion 511 and having a larger thickness than the vibrating portion 511. In the embodiment, the vibrator substrate 51 is an AT cut quartz crystal substrate.

The electrodes 52 have a pair of excitation electrodes 521, 522, a pair of pad electrodes 523, 524, and a pair of lead wires 525, 526. The excitation electrode 521 is placed on an upper surface of the vibrating portion 511. The excitation electrode 522 is placed on a lower surface of the vibrating portion 511. The excitation electrode 521 and the excitation electrode 522 are placed in positions facing via the vibrator substrate 51. The pad electrode 523 is placed on an upper surface of the thick portion 512. The pad electrode 524 is placed on a lower surface of the thick portion 512. The pad electrode 523 and the pad electrode 524 are placed in positions facing via the vibrator substrate 51. The lead wire 525 is placed on the upper surface of the thick portion 512 and electrically couples the excitation electrode 521 and the pad electrode 523. The lead wire 526 is placed on the lower surface of the thick portion 512 and electrically couples the excitation electrode 522 and the pad electrode 524.

Drive signals are applied to the excitation electrodes 521, 522 via the pad electrodes 523, 524 and the lead wires 525, 526, and thereby, a thickness-shear vibration may be excited in the vibrating portion 511 sandwiched between the excitation electrodes 521, 522.

As above, the vibrator element 5 is briefly explained.

Note that the configuration of the vibrator element 5 is not limited to the above described configuration. For example, the vibrator element 5 is not limited to a vibrator element in a plate shape that produces a thickness-shear vibration. For example, a vibrator element having a plurality of vibrating arms flexurally vibrating in in-plane directions or a vibrator element having a plurality of vibrating arms flexurally vibrating in out-of-plane directions may be employed. Further, for example, a vibrator element using an X cut quartz crystal substrate, a Y cut quartz crystal substrate, a Z cut quartz crystal substrate, a BT cut quartz crystal substrate, an SC cut quartz crystal substrate, an ST cut quartz crystal substrate, or the like as the vibrator substrate 51 may be employed. Alternatively, for example, a vibrator element using another piezoelectric material than the quartz crystal may be employed. Alternatively, for example, a SAW (Surface Acoustic Wave) resonator or an MEMS (Micro Electro Mechanical Systems) vibrator in which a piezoelectric element is placed on a semiconductor substrate of silicon or the like may be employed.

Next, the package 6 housing the vibrator element 5 will be explained.

As shown in FIG. 4, the package 6 has a base member 61 and a lid 62 as a lid member. In the embodiment, the lid 62 is placed on a lower surface of the base member 61. That is, the upper surface of the vibrator 4 is an upper surface of the base member 61 and the lower surface of the vibrator 4 is a lower surface of the lid 62.

The base member 61 is in a box shape having a recessed portion 611. The recessed portion 611 has an opening part at the lower surface side of the base member 61. In other words, the base member 61 has a base portion 612 in a plate shape and a side wall portion 613 in a frame shape stood downward from the outer peripheral part of the base portion 612.

The lid 62 is in a plate shape. The lid 62 is bonded to the lower surface of the base member 61 to close the opening part of the recessed portion 611. The recessed portion 611 is closed by the lid 62, and thereby, a housing space S is formed. The vibrator element 5 is housed in the housing space S. For example, the housing space S is depressurized.

Materials forming the base member 61 and the lid 62 are not particularly limited. As the base member 61 and the lid 62, e.g. ceramics substrates of aluminum oxide, glass substrates, semiconductor substrates of silicon, or the like may be used. Note that, when the base member 61 is a ceramics substrate, an alloy such as kovar having a coefficient of linear expansion approximating the ceramics substrate may be used for the lid 62.

Further, internal electrodes 615, 616 are placed on a bottom surface of the recessed portion 611.

The vibrator element 5 is placed so that the upper surface of the vibrator substrate 51 may face the bottom surface of the recessed portion 611. The pad electrode 523 placed on the upper surface of the vibrator substrate 51 and the internal electrode 615 are bonded via a conductive adhesive 617. That is, by the conductive adhesive 617, the vibrator element 5 is fixed to the bottom surface of the recessed portion 611 and the pad electrode 523 and the internal electrode 615 are electrically coupled. The pad electrode 524 placed on the lower surface of the vibrator substrate 51 and the internal electrode 616 are electrically coupled via a conductive wire W1.

As shown in FIGS. 2 and 4, on the upper surface of the base member 61, the first electrode terminal 63, the second electrode terminal 64, the third electrode terminal 65, and the fourth electrode terminal 66 are placed.

As shown in FIG. 4, the first electrode terminal 63 is electrically coupled to the internal electrode 615 via an internal wire (not shown) provided within the base member 61. That is, as shown in FIGS. 4 and 5, the first electrode terminal 63 is electrically coupled to the excitation electrode 521 via the internal electrode 615, the pad electrode 523, and the lead wire 525. Further, as shown in FIGS. 1 and 2, the first electrode terminal 63 and the fifth coupling wire 215 placed on the upper surface of the base 2 are electrically coupled via a conductive wire W2.

As shown in FIG. 4, the second electrode terminal 64 is electrically coupled to the internal electrode 616 via an internal wire (not shown) provided within the base member 61. That is, as shown in FIGS. 4 and 5, the second electrode terminal 64 is electrically coupled to the excitation electrode 522 via the internal electrode 616, the pad electrode 524, and the lead wire 526. Further, as shown in FIGS. 1 and 2, the second electrode terminal 64 and the sixth coupling wire 216 placed on the upper surface of the base 2 are electrically coupled via a conductive wire W3.

The third electrode terminal 65 is a ground terminal for coupling to the ground potential. The third electrode terminal 65 is electrically coupled to the respective units of the vibrator 4, e.g. the vibrator element 5 and the lid 62 via internal wires (not shown) provided within the base member 61. Further, the third electrode terminal 65 and the first coupling wire 211 placed on the upper surface of the base 2 are electrically coupled via a conductive wire W4. Note that the third electrode terminal 65 may be a dummy terminal not electrically coupled to the respective units of the vibrator 4. Alternatively, the third electrode terminal 65 may be omitted.

The wires W2, W3, W4 are bonding wires formed using wire bonding. As the wires W2, W3, W4, e.g. gold wires, copper wires, aluminum wires, or the like may be used.

The fourth electrode terminal 66 is a dummy terminal not electrically coupled to the respective units of the vibrator 4. In the embodiment, the fourth electrode terminal 66 as the dummy terminal electrically floats, however, may be coupled to the ground potential like the third electrode terminal 65. Alternatively, the fourth electrode terminal 66 may be omitted.

As above, the base 2, the semiconductor element 3, and the vibrator 4 are explained.

Next, the first wires 101, 102, the second wire 103, and the shield wire 20 of the vibrator device 1 will be explained.

First, the first wires 101, 102 will be explained.

As shown in FIGS. 1 and 2, the first wires 101, 102 are wires electrically coupling between the excitation electrodes 521, 522 of the vibrator 4 and the semiconductor element 3. That is, the first wires 101, 102 are a pair of drive wires for applying drive signals to the excitation electrodes 521, 522 and oscillating the vibrator 4. Note that, as below, when the first wire 101 electrically coupling between the excitation electrode 521 and the semiconductor element 3 and the first wire 102 electrically coupling between the excitation electrode 522 and the semiconductor element 3 are distinguished, the first wire 101 electrically coupling between the excitation electrode 521 and the semiconductor element 3 is also referred to as "first drive wire 101" and the first wire 102 electrically coupling between the excitation electrode 522 and the semiconductor element 3 is also referred to as "second drive wire 102".

In the embodiment, the first drive wire 101 has the first electrode terminal 63 placed on the upper surface of the vibrator 4, the fifth coupling wire 215 placed on the upper surface of the base 2, and the wire W2 electrically coupling the first electrode terminal 63 and the fifth coupling wire 215. The second drive wire 102 has the second electrode terminal 64 placed on the upper surface of the vibrator 4, the sixth coupling wire 216 placed on the upper surface of the base 2, and the wire W3 electrically coupling the second electrode terminal 64 and the sixth coupling wire 216.

The drive signals output from the fifth coupling terminal 325 and the sixth coupling terminal 326 formed on the lower surface of the semiconductor element 3 are applied to the excitation electrodes 521, 522 via the first drive wire 101 and the second drive wire 102, respectively. Thereby, the vibrator 4 oscillates.

Next, the second wire 103 will be explained.

As shown in FIGS. 1 and 3, the second wire 103 is a wire electrically coupling between the second external terminal 222 as the external output terminal placed on the base 2 and the semiconductor element 3. That is, the second wire 103 is the output wire for outputting the reference signal output from the semiconductor element 3 to the outside of the vibrator device 1.

In the embodiment, the second wire 103 has the second external terminal 222, the second coupling wire 212, and the via 232 electrically coupling the second external terminal 222 and the second coupling wire 212. The reference signal output from the second coupling terminal 322 placed on the lower surface of the semiconductor element 3 is output to the outside of the vibrator device 1 via the second wire 103 as the output wire.

Next, the shield wire 20 will be explained.

As shown in FIGS. 1 and 2, the shield wire 20 is a wire placed between the first wires 101, 102 and the second wire 103. The shield wire 20 is placed between the first wires 101, 102 and the second wire 103, and thereby, electric fields generated between the first wires 101, 102 and the second wire 103 are shielded by the shield wire 20. That is, the shield wire 20 is placed between the first wires 101, 102 and the second wire 103, and thereby, parasitic capacitances produced between the first wires 101, 102 for oscillating the vibrator 4 and the second wire 103 outputting the reference signal may be reduced. The parasitic capacitances produced between the first wires 101, 102 and the second wire 103 are reduced, and thereby, the difference between the parasitic capacitance between the first drive wire 101 and the second wire 103 and the parasitic capacitance between the second drive wire 102 and the second wire 103 may be reduced. Therefore, the fluctuations of the output frequency relative to the fluctuations of the power supply voltage are smaller and the vibrator device 1 with good frequency-power characteristics may be provided.

Next, the shield wire 20 will be explained in detail.

In the embodiment, the first coupling wire 211 placed on the upper surface of the base 2 functions as the shield wire 20. Specifically, the first coupling wire 211 has the function as the shield wire 20 coupled to the ground potential in addition to the function of electrically coupling the first external terminal 221 as the ground terminal of the vibrator device 1 and the first coupling terminal 321 as the ground terminal of the semiconductor element 3.

As shown in FIGS. 2 and 3, the first coupling wire 211 has a part overlapping with the vibrator 4 in the plan view. Of the first coupling wire 211, the part overlapping with the vibrator 4 in the plan view has substantially the same shape as the vibrator 4. Of the first coupling wire 211, the part overlapping with the vibrator 4 in the plan view functions as the shield wire 20.

As shown in FIGS. 1 and 2, in the embodiment, for example, the first coupling wire 211 as the shield wire 20 is placed between the fifth coupling wire 215 and sixth coupling wire 216 of the first wires 101, 102 and the second coupling wire 212 of the second wire 103. Further, for example, the first coupling wire 211 as the shield wire 20 is placed between the wires W2, W3 of the first wires 101, 102 and the second external terminal 222 of the second wire 103.

That is, the first coupling wire 211 as the shield wire 20 is placed between at least a part of the first wires 101, 102 and at least a part of the second wire 103.

In other words, there is a straight line passing all of the first wires 101, 102, the first coupling wire 211 as the shield wire 20, and the second wire 103. Specifically, there is a straight line passing all of the first drive wire 101, the shield wire 20, and the second wire 103 or a straight line passing all of the second drive wire 102, the shield wire 20, and the second wire 103. Alternatively, there may be both the straight line passing all of the first drive wire 101, the shield wire 20, and the second wire 103 and the straight line passing all of the second drive wire 102, the shield wire 20, and the second wire 103.

As described above, the first coupling wire 211 as the shield wire 20 is placed between at least a part of the first wires 101, 102 and at least a part of the second wire 103, and thereby, the difference between the parasitic capacitance between the first drive wire 101 and the second wire 103 and the parasitic capacitance between the second drive wire 102 and the second wire 103 may be reduced. Therefore, the fluctuations of the output frequency relative to the fluctuations of the power supply voltage are smaller and the vibrator device 1 with good frequency-power characteristics may be provided.

In the embodiment, the shield wire 20 is placed on the base 2, however, the member on which the shield wire 20 is placed is not limited to the base 2. The shield wire 20 may be placed between at least a part of the first wires 101, 102 and at least a part of the second wire 103 to shield at least a part of the electric fields generated between the first wires 101, 102 and the second wire 103. For example, the shield wire 20 may be placed on the semiconductor element 3 or the vibrator 4.

Further, in the embodiment, the shield wire 20 is placed on the upper surface as the surface facing the semiconductor element 3 in the base 2, however, may be placed inside of the base 2.

Furthermore, in the embodiment, the shield wire 20 is placed between a part of the first wires 101, 102 and a part of the second wire 103, however, may be placed between the entire of the first wires 101, 102 and the entire of the second wire 103. For example, the shield wires 20 are placed not only on the upper surface of the base 2 but also in a plurality of locations inside of the base 2 and on the semiconductor element 3, and thereby, the shield wires 20 may be placed between the entire of the first wires 101, 102 and the entire of the second wire 103.

As described above, the following effects may be obtained according to the embodiment.

The vibrator device 1 has the base 2, the semiconductor element 3 having the oscillation circuit 33, and the vibrator 4 having the excitation electrodes 521, 522 sequentially stacked, and includes the first wires 101, 102 electrically coupling between the excitation electrodes 521, 522 and the semiconductor element 3, the second wire 103 electrically coupling between the second external terminal 222 as the external output terminal placed on the base 2 and the semiconductor element 3, and the shield wire 20 placed between at least a part of the first wires 101, 102 and at least a part of the second wire 103.

Thereby, the difference between the parasitic capacitance between the first drive wire 101 as one wire of the first wires 101, 102 for oscillating the vibrator 4 and the second wire 103 as the wire outputting the reference signal and the parasitic capacitance between the second drive wire 102 as the other wire of the first wires 101, 102 and the second wire 103 may be reduced. Therefore, the fluctuations of the output frequency relative to the fluctuations of the power supply voltage are smaller and the vibrator device 1 with good frequency-power characteristics may be provided.

2. Embodiment 2

Next, a vibrator device 1a according to embodiment 2 will be explained with reference to FIG. 6.

The vibrator device 1a of embodiment 2 is the same as that of embodiment 1 except that the semiconductor substrate 31 of the semiconductor element 3 is coupled to a ground potential and the semiconductor substrate 31 functions as a shield wire 20a. Note that the same configurations as those of embodiment 1 have the same signs and the overlapping explanation will be omitted.

In the embodiment, the semiconductor substrate 31 of the semiconductor element 3 is coupled to the ground potential. For example, the semiconductor substrate 31 and the first coupling terminal 321 as the ground terminal shown in FIG. 2 are electrically coupled via an internal wire (not shown) provided within the circuit unit 32, and thereby, the semiconductor substrate 31 may be coupled to the ground potential. The semiconductor substrate 31 coupled to the ground potential corresponds to a constant potential layer held at a constant potential. That is, the semiconductor element 3 has the semiconductor substrate 31 as the constant potential layer held at the constant potential.

Figure 6:
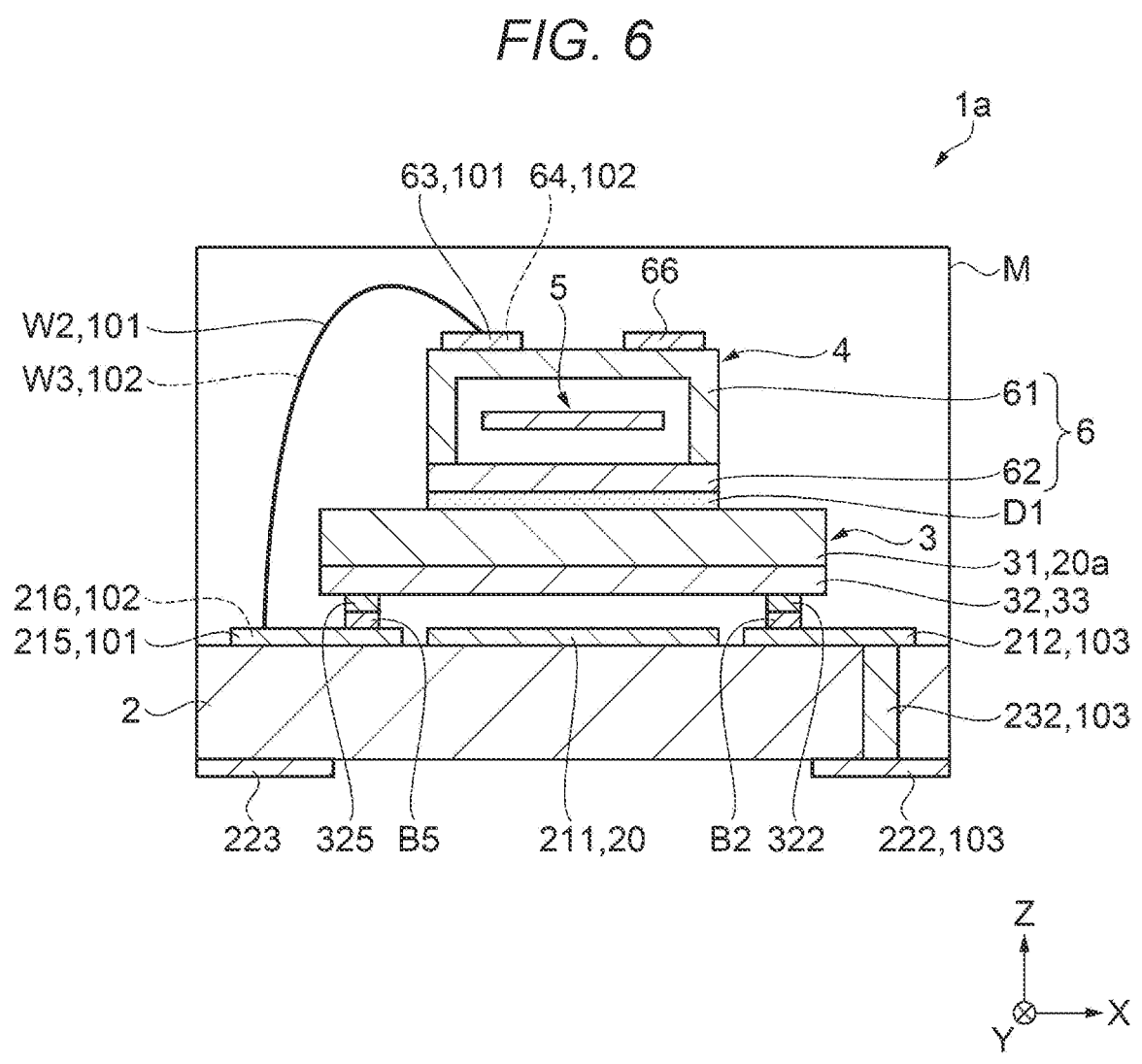

As shown in FIG. 6, the semiconductor substrate 31 as the constant potential layer may function as the shield wire 20a.

In the embodiment, for example, the semiconductor substrate 31 as the shield wire 20*a* is placed between the first electrode terminal 63 and second electrode terminal 64 of the first wires 101, 102 and the second coupling wire 212 of the second wire 103.

As described above, the semiconductor substrate 31 as the shield wire 20*a* is placed between at least a part of the first wires 101, 102 and at least a part of the second wire 103, and thereby, the difference between the parasitic capacitance between the first drive wire 101 and the second wire 103 and the parasitic capacitance between the second drive wire 102 and the second wire 103 may be reduced. Therefore, the fluctuations of the output frequency relative to the fluctuations of the power supply voltage are smaller and the vibrator device 1*a* with good frequency-power characteristics may be provided.

In the embodiment, the semiconductor substrate 31 coupled to the ground potential is the constant potential layer as the shield wire 20*a*, however, the constant potential layer of the semiconductor element 3 is not necessarily the semiconductor substrate 31. For example, a conductive layer coupled to the ground potential may be placed on the upper surface, the lower surface, or inside of the semiconductor element 3 and the conductive layer may be used as the constant potential layer as the shield wire 20*a*.

Further, in the embodiment, the vibrator device 1*a* has the shield wire 20 in addition to the shield wire 20*a*, however, the shield wire 20 may be omitted.

As described above, according to the embodiment, the semiconductor substrate 31 as the constant potential layer held at the constant potential is placed as the shield wire 20*a* between at least a part of the first wires 101, 102 and at least a part of the second wire 103, and thereby, the same effects as those of embodiment 1 may be obtained.

3. Embodiment 3

Next, a vibrator device 1*b* according to embodiment 3 will be explained with reference to FIG. 7.

The vibrator device 1*b* of embodiment 3 is the same as that of embodiment 1 except that the lid 62 functions as a shield wire 20*b*. Note that the same configurations as those of embodiment 1 have the same signs and the overlapping explanation will be omitted.

In the embodiment, the lid 62 of the vibrator 4 is formed using a conductive material. For example, the lid 62 is formed using an alloy such as kovar.

Figure 7:
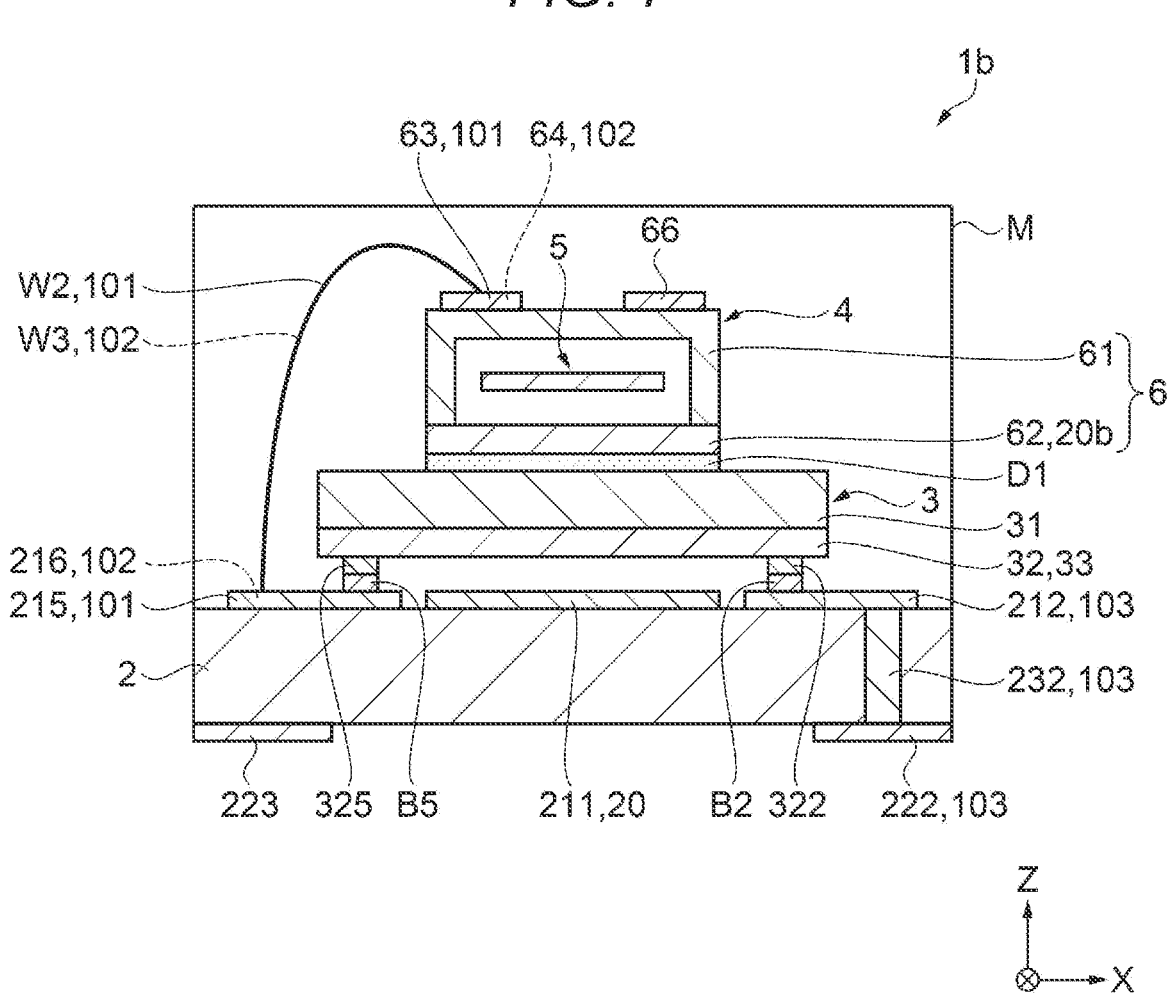
FIG. 7 is a sectional view of the vibrator device according to embodiment 3.

As shown in FIG. 7, the lid 62 formed using the conductive material may function as the shield wire 20*b*.

In the embodiment, for example, the lid 62 as the shield wire 20*b* is placed between the first electrode terminal 63 and second electrode terminal 64 of the first wires 101, 102 and the second coupling wire 212 of the second wire 103.

As described above, the lid 62 as the shield wire 20*b* is placed between at least a part of the first wires 101, 102 and at least a part of the second wire 103, and thereby, the difference between the parasitic capacitance between the first drive wire 101 and the second wire 103 and the parasitic capacitance between the second drive wire 102 and the second wire 103 may be reduced. Therefore, the fluctuations of the output frequency relative to the fluctuations of the power supply voltage are smaller and the vibrator device 1*b* with good frequency-power characteristics may be provided.

The lid 62 as the shield wire 20*b* may electrically float or may be coupled to the ground potential. The lid 62 is coupled to the ground potential, and thereby, compared to a case where the lid 62 electrically floats, the difference between the parasitic capacitance between the first drive wire 101 and the second wire 103 and the parasitic capacitance between the second drive wire 102 and the second wire 103 may be further reduced.

Here, an example of the configuration in which the lid 62 as the shield wire 20*b* is coupled to the ground potential is explained.

For example, the adhesive D1 bonding the upper surface of the semiconductor element 3 and the lower surface of the lid 62 may be a conductive adhesive. The conductive adhesive is used as the adhesive D1, and thereby, the lid 62 is electrically coupled to the semiconductor substrate 31 of the semiconductor element 3 via the adhesive D1. Accordingly, the semiconductor substrate 31 is coupled to the ground potential, and thereby, the lid 62 as the shield wire 20*b* may be coupled to the ground potential.

Note that the configuration in which the lid 62 as the shield wire 20*b* is coupled to the ground potential is not limited to the above described configuration. For example, the third electrode terminal 65 as the ground terminal placed on the upper surface of the vibrator 4 and the lid 62 may be electrically coupled via an internal wire (not shown) within the base member 61.

Further, in the embodiment, the vibrator device 1*b* has the shield wire 20 in addition to the shield wire 20*b*, however, the shield wire 20 may be omitted.

As described above, according to the embodiment, the lid 62 is placed as the shield wire 20*b* between at least a part of the first wires 101, 102 and at least a part of the second wire 103, and thereby, the same effects as those of embodiment 1 may be obtained.

4. Embodiment 4

Next, a vibrator device 1*c* according to embodiment 4 will be explained with reference to FIGS. 8 to 12. Note that the mold portion M is omitted in FIG. 11 for convenience of explanation.

The vibrator device 1*c* of embodiment 4 is the same as that of embodiment 1 except that a base 2*c* is a multilayer substrate and a shield wire 20*c* is placed between layers of the multilayer substrate. Note that the same configurations as those of embodiment 1 have the same signs and the overlapping explanation will be omitted.

Figure 8:
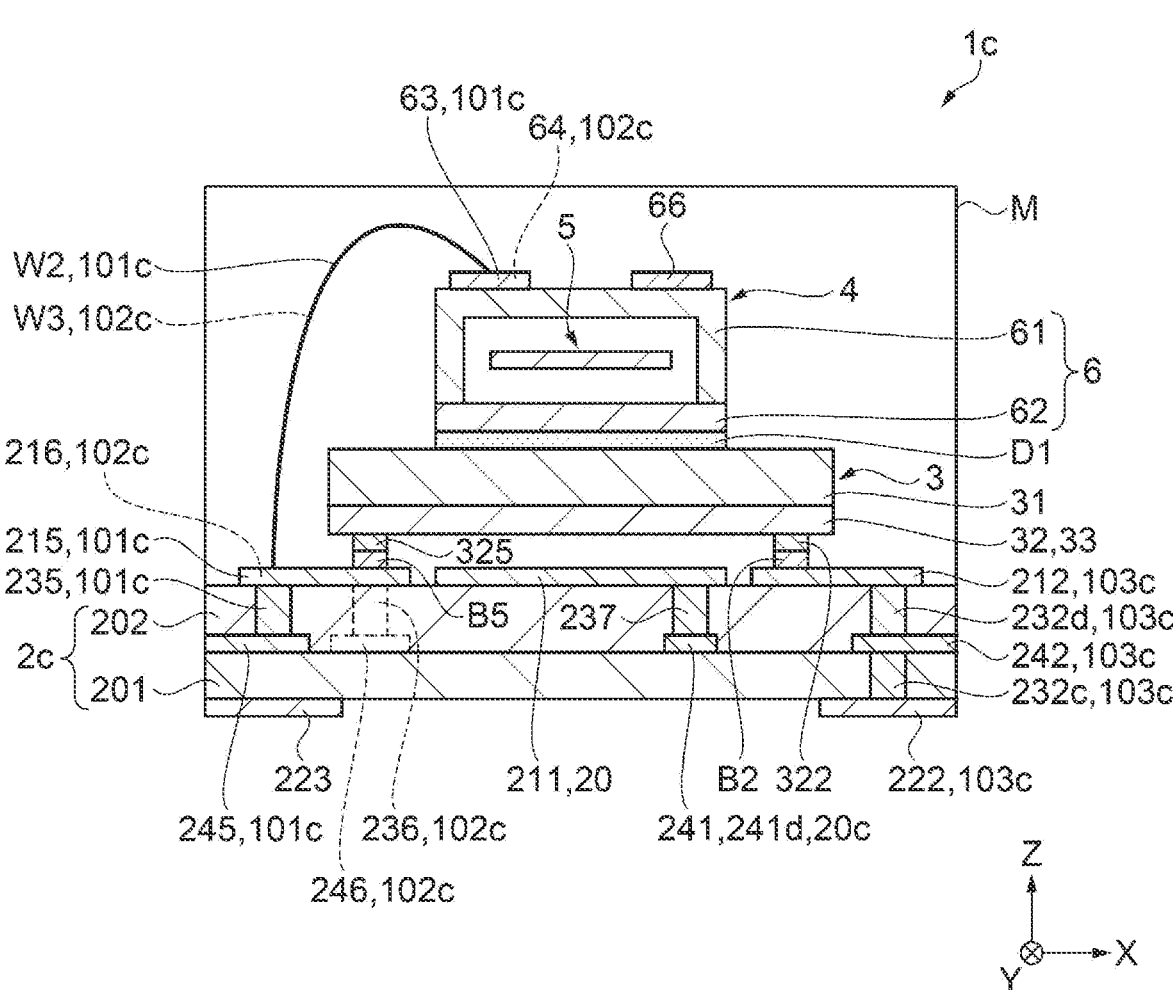
FIG. 8 is a sectional view of a vibrator device according to embodiment 4.

As shown in FIG. 8, the base 2*c* is the multilayer substrate in which a plurality of substrates are stacked. In the embodiment, the base 2*c* is the multilayer substrate in which a first base substrate 201 and a second base substrate 202 are stacked. The second base substrate 202 is placed on an upper surface of the first base substrate 201. An upper surface of the second base substrate 202 is an upper surface of the base 2*c*. A lower surface of the first base substrate 20 is a lower surface of the base 2*c*.

In the embodiment, the base 2*c* is the multilayer substrate in which two substrates of the first base substrate 201 and the second base substrate 202 are stacked, however, the base 2*c* may be a multilayer substrate in which three or more substrates are stacked.

First, wires placed between the layers of the first base substrate 201 and the second base substrate 202 will be explained.

Figure 9:
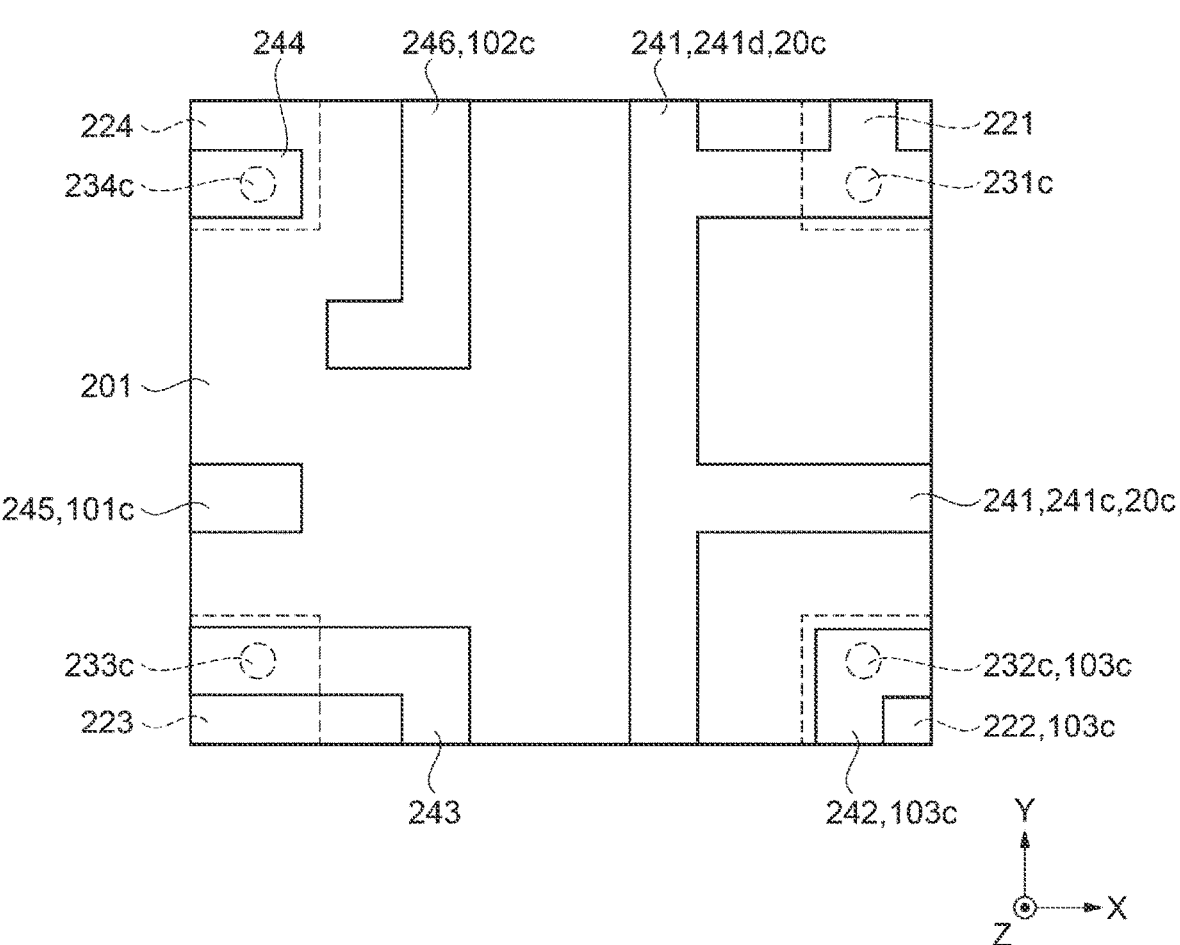
FIG. 9 is a plan view of a first base substrate according to embodiment 4.
Figure 10:
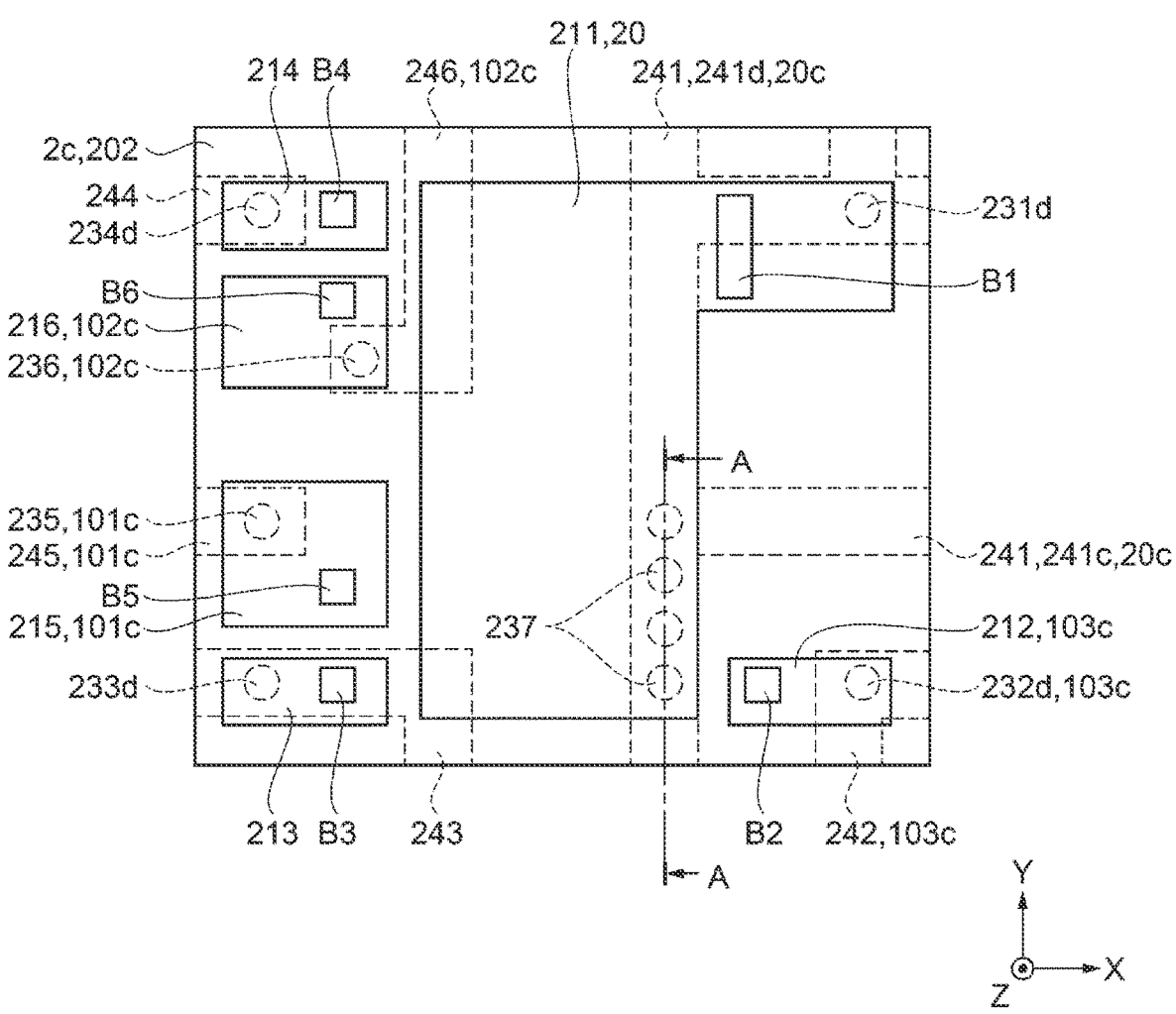
FIG. 10 is a plan view of a base according to embodiment 4.

As shown in FIGS. 9 and 10, a seventh coupling wire 241, an eighth coupling wire 242, a ninth coupling wire 243, a tenth coupling wire 244, an eleventh coupling wire 245, and a twelfth coupling wire 246 are placed between the layers of the first base substrate 201 and the second base substrate 202. The seventh coupling wire 241 is coupled to a ground potential and may function as the shield wire 20c as will be described later.

Note that, in FIG. 9, for convenience of explanation, the seventh coupling wire 241, the eighth coupling wire 242, the ninth coupling wire 243, the tenth coupling wire 244, the eleventh coupling wire 245, and the twelfth coupling wire 246 placed between the layers of the first base substrate 201 and the second base substrate 202 are shown to be placed on the upper surface of the first base substrate 201.

Next, the first base substrate 201 will be explained.

As shown in FIG. 9, the first external terminal 221, the second external terminal 222, the third external terminal 223, and the fourth external terminal 224 are placed on the lower surface of the first base substrate 201.

In the first base substrate 201, a plurality of vias 231c, 232c, 233c, 234c penetrating between the upper surface and the lower surface of the first base substrate 201 are provided. The vias 231c, 232c, 233c, 234c are respectively through electrodes formed by filling of through holes penetrating the first base substrate 201 with conductors.

The seventh coupling wire 241 and the first external terminal 221 are electrically coupled via the via 231c. The eighth coupling wire 242 and the second external terminal 222 are electrically coupled via the via 232c. The ninth coupling wire 243 and the third external terminal 223 are electrically coupled via the via 233c. The tenth coupling wire 244 and the fourth external terminal 224 are electrically coupled via the via 234c.

Next, the second base substrate 202 will be explained.

Figure 11:
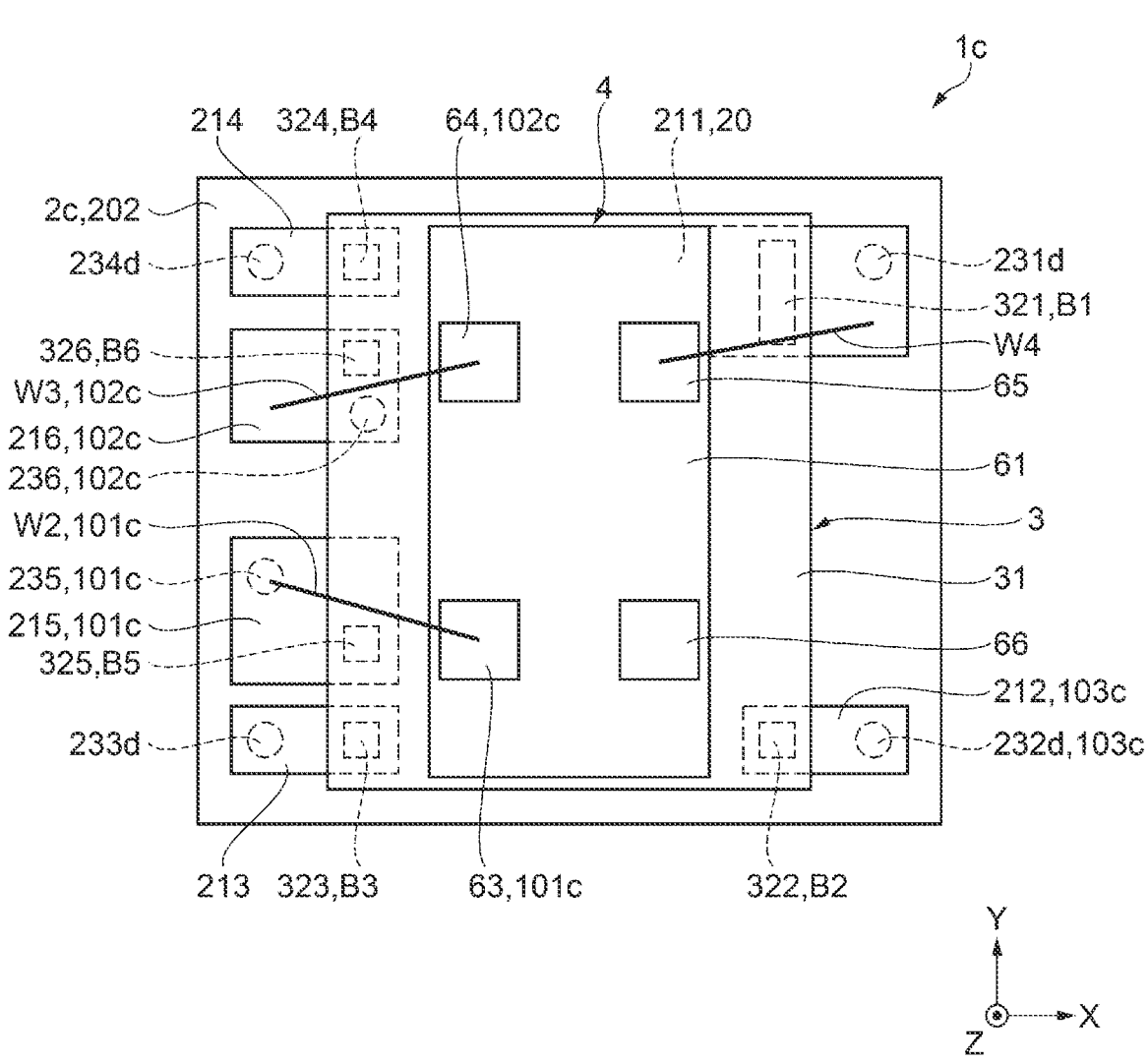
FIG. 11 is a plan view of the vibrator device according to embodiment 4.

As shown in FIGS. 10 and 11, on the upper surface of the second base substrate 202, the first coupling wire 211, the second coupling wire 212, the third coupling wire 213, the fourth coupling wire 214, the fifth coupling wire 215, and the sixth coupling wire 216 are placed.

In the second base substrate 202, a plurality of vias 231d, 232d, 233d, 234d, 235, 236 penetrating between the upper surface and the lower surface of the second base substrate 202 are provided. The vias 231d, 232d, 233d, 234d, 235, 236 are respectively through electrodes formed by filling of through holes penetrating the second base substrate 202 with conductors.

The first coupling wire 211 and the seventh coupling wire 241 are electrically coupled via the via 231d. The second coupling wire 212 and the eighth coupling wire 242 are electrically coupled via the via 232d. The third coupling wire 213 and the ninth coupling wire 243 are electrically coupled via the via 233d. The fourth coupling wire 214 and the tenth coupling wire 244 are electrically coupled via the via 234d.

Further, the fifth coupling wire 215 and the eleventh coupling wire 245 are electrically coupled via the via 235. The sixth coupling wire 216 and the twelfth coupling wire 246 are electrically coupled via the via 236.

Next, first wires 101c, 102c, a second wire 103c, and the shield wire 20c of the vibrator device 1c will be explained.

First, the first wires 101c, 102c will be explained.

As shown in FIGS. 8 and 11, in the embodiment, of the first wires 101c, 102c, the first drive wire 101c has the first electrode terminal 63 placed on the upper surface of the vibrator 4, the fifth coupling wire 215 placed on the upper surface of the base 2c, the wire W2 electrically coupling the first electrode terminal 63 and the fifth coupling wire 215, the eleventh coupling wire 245 placed between the layers of the first base substrate 201 and the second base substrate 202, and the via 235 electrically coupling the fifth coupling wire 215 and the eleventh coupling wire 245. Of the first wires 101c, 102c, the second drive wire 102c has the second electrode terminal 64 placed on the upper surface of the vibrator 4, the sixth coupling wire 216 placed on the upper surface of the base 2c, the wire W3 electrically coupling the second electrode terminal 64 and the sixth coupling wire 216, the twelfth coupling wire 246 placed between the layers of the first base substrate 201 and the second base substrate 202, and the via 236 electrically coupling the sixth coupling wire 216 and the twelfth coupling wire 246.

Next, the second wire 103c will be explained.

As shown in FIGS. 8 and 11, in the embodiment, the second wire 103c has the second external terminal 222 placed on the lower surface of the base 2c, the eighth coupling wire 242 placed between the layers of the first base substrate 201 and the second base substrate 202, the via 232c electrically coupling the second external terminal 222 and the eighth coupling wire 242, the second coupling wire 212 placed on the upper surface of the base 2c, and the via 232d electrically coupling the second coupling wire 212 and the eighth coupling wire 242.

Next, the shield wire 20c will be explained. In the embodiment, the seventh coupling wire 241 placed between the layers of the first base substrate 201 and the second base substrate 202 has a function as the shield wire 20c coupled to the ground potential in addition to the function of electrically coupling the first external terminal 221 as the ground terminal of the vibrator device 1c and the first coupling wire 211 placed on the upper surface of the base 2c.

As shown in FIGS. 9 and 10, in the embodiment, the seventh coupling wire 241 as the shield wire 20c has a first partial wire 241c extending in the X directions and a second partial wire 241d extending in the Y directions. The second partial wire 241d has an area overlapping with the first coupling wire 211 as the shield wire 20 in the plan view.

As shown in FIGS. 8 and 9, in the embodiment, for example, the seventh coupling wire 241 as the shield wire 20c is placed between the eleventh coupling wire 245 and twelfth coupling wire 246 of the first wires 101c, 102c and the eighth coupling wire 242 of the second wire 103c.

In other words, the seventh coupling wire 241 as the shield wire 20c is placed between at least a part of the first wires 101c, 102c and at least a part of the second wire 103c.

As described above, the seventh coupling wire 241 as the shield wire 20c is placed between at least a part of the first wires 101c, 102c and at least a part of the second wire 103c, and thereby, the difference between the parasitic capacitance between the first drive wire 101c and the second wire 103c and the parasitic capacitance between the second drive wire 102c and the second wire 103c may be reduced. Therefore, the fluctuations of the output frequency relative to the fluctuations of the power supply voltage are smaller and the vibrator device 1c with good frequency-power characteristics may be provided.

Note that, in the embodiment, the vibrator device 1c has the shield wire 20 in addition to the shield wire 20c, however, the shield wire 20 may be omitted.

Further, as shown in FIG. 9, in the embodiment, in the plan view, the first partial wire 241c of the seventh coupling wire 241 as the shield wire 20c placed between the layers of the first base substrate 201 and the second base substrate 202 is placed at the plus side in the Y direction with respect to the eighth coupling wire 242 as the second wire 103c placed between the layers of the first base substrate 201 and the second base substrate 202. Further, the second partial wire 241d of the seventh coupling wire 241 as the shield wire 20c is placed at the minus side in the X direction with respect to the eighth coupling wire 242. That is, the seventh coupling wire 241 as the shield wire 20*c* has the first partial wire 241*c* placed at the plus side in the Y direction with respect to the eighth coupling wire 242 and the second partial wire 241*d* placed at the minus side in the X direction with respect to the eighth coupling wire 242 in the plan view.

In other words, the seventh coupling wire 241 as the shield wire 20*c* placed between the layers of the first base substrate 201 and the second base substrate 202 is placed in two directions of the X direction as the first direction and the Y direction as the second direction crossing the X direction with respect to the eighth coupling wire 242 as the second wire 103*c* placed between the layers of the first base substrate 201 and the second base substrate 202 in the plan view.

As described above, the seventh coupling wire 241 as the shield wire 20*c* is placed in the X direction and the Y direction with respect to the eighth coupling wire 242 in the plan view, and thereby, the difference between the parasitic capacitance between the first drive wire 101*c* and the second wire 103*c* and the parasitic capacitance between the second drive wire 102*c* and the second wire 103*c* may be further reduced.

Further, as shown in FIGS. 9 and 10, in the embodiment, the first partial wire 241*c* extending in the X directions of the seventh coupling wire 241 as the shield wire 20*c* extends to a side surface of the base 2*c* at the plus side in the X direction. The second partial wire 241*d* extending in the Y directions of the seventh coupling wire 241 as the shield wire 20*c* extends to a side surface of the base 2*c* at the minus side in the Y direction.

As described above, the seventh coupling wire 241 as the shield wire 20*c* is extended to the side surfaces of the base 2*c*, and thereby, the difference between the parasitic capacitance between the first drive wire 101*c* and the second wire 103*c* and the parasitic capacitance between the second drive wire 102*c* and the second wire 103*c* may be further reduced.

Figure 12:
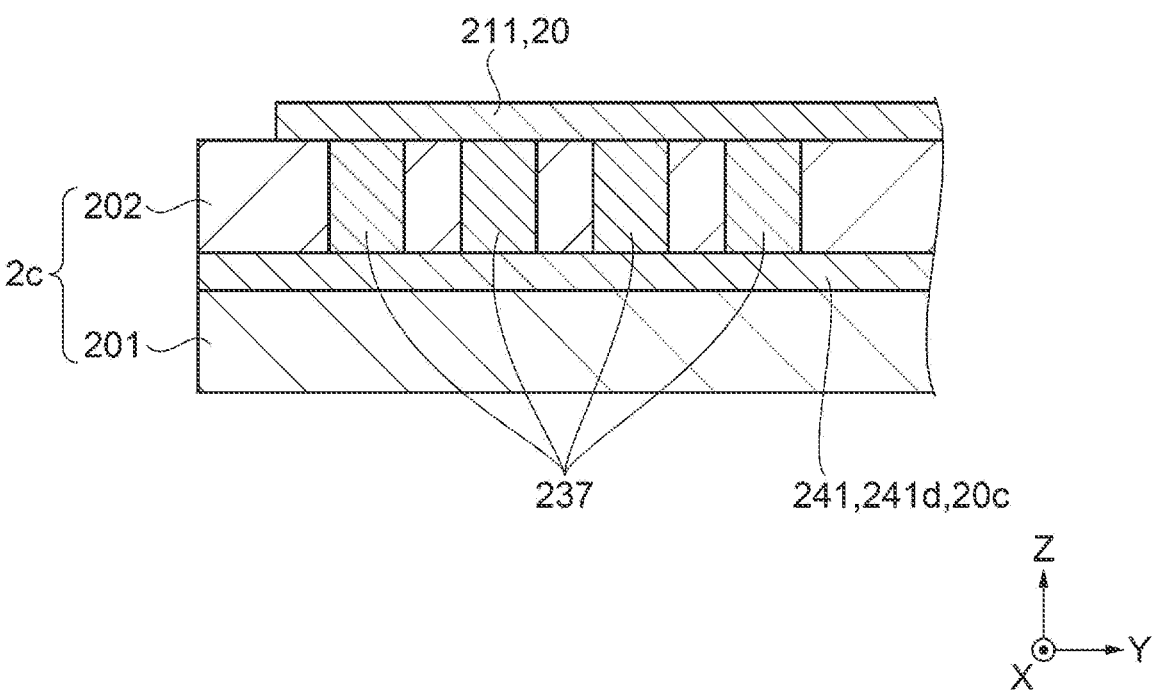
FIG. 12 is a sectional view along line A-A in FIG. 10.

Furthermore, as shown in FIGS. 10 and 12, in the embodiment, in the second base substrate 202, vias 237 penetrating between the upper surface and the lower surface of the second base substrate 202 are provided. The vias 237 are through electrodes formed by filling of through holes penetrating the second base substrate 202 with conductors.

The vias 237 are placed in positions overlapping with the seventh coupling wire 241 as the shield wire 20*c* in the plan view. The vias 237 are bonded to the seventh coupling wire 241 and electrically coupled to the seventh coupling wire 241. That is, the vias 237 are electrically coupled to the seventh coupling wire 241 as the shield wire 20*c*, and thereby, function as the shield wire 20*c*.

As described above, the vias 237 electrically coupled to the seventh coupling wire 241 as the shield wire 20*c* placed between the layers of the first base substrate 201 and the second base substrate 202 are provided, and thereby, the difference between the parasitic capacitance between the first drive wire 101*c* and the second wire 103*c* and the parasitic capacitance between the second drive wire 102*c* and the second wire 103*c* may be further reduced.

Further, in the embodiment, the vias 237 are placed in positions overlapping with the first coupling wire 211 as the shield wire 20 in the plan view. The vias 237 are bonded to the first coupling wire 211 and electrically coupled to the first coupling wire 211. That is, the first coupling wire 211 and the seventh coupling wire 241 are electrically coupled via the vias 237.

As described above, the first coupling wire 211 as the shield wire 20 and the seventh coupling wire 241 as the shield wire 20*c* are electrically coupled via the vias 237, and thereby, the difference between the parasitic capacitance between the first drive wire 101*c* and the second wire 103*c* and the parasitic capacitance between the second drive wire 102*c* and the second wire 103*c* may be further reduced.

Note that, in the embodiment, the vias 237 are electrically coupled to the first coupling wire 211 as the shield wire 20, however, not necessarily electrically coupled to the first coupling wire 211. Further, in the embodiment, the vias 237 are provided in the second base substrate 202, however, may be provided in the first base substrate 201. Furthermore, in the embodiment, the four vias 237 are provided, however, the vias 237 are not necessarily provided. When the vias 237 are provided, the number of the vias 237 may be any number equal to or larger than one.

As described above, according to the embodiment, the base 2*c* is the multilayer substrate having the first base substrate 201 and the second base substrate 202 and the seventh coupling wire 241 as the shield wire 20*c* is placed between the layers of the first base substrate 201 and the second base substrate 202, and thereby, the same effects as those of embodiment 1 may be obtained.

5. Embodiment 5

Next, a vibrator device 1*d* according to embodiment 5 will be explained with reference to FIGS. 13 to 15. Note that the mold portion M is omitted in FIG. 14 for convenience of explanation.

The vibrator device 1*d* of embodiment 5 is the same as that of embodiment 1 except that the semiconductor element 3 is placed upside down and the semiconductor element 3 and the base 2 are electrically coupled using wire bonding. Note that the same configurations as those of embodiment 1 have the same signs and the overlapping explanation will be omitted.

Figure 13:
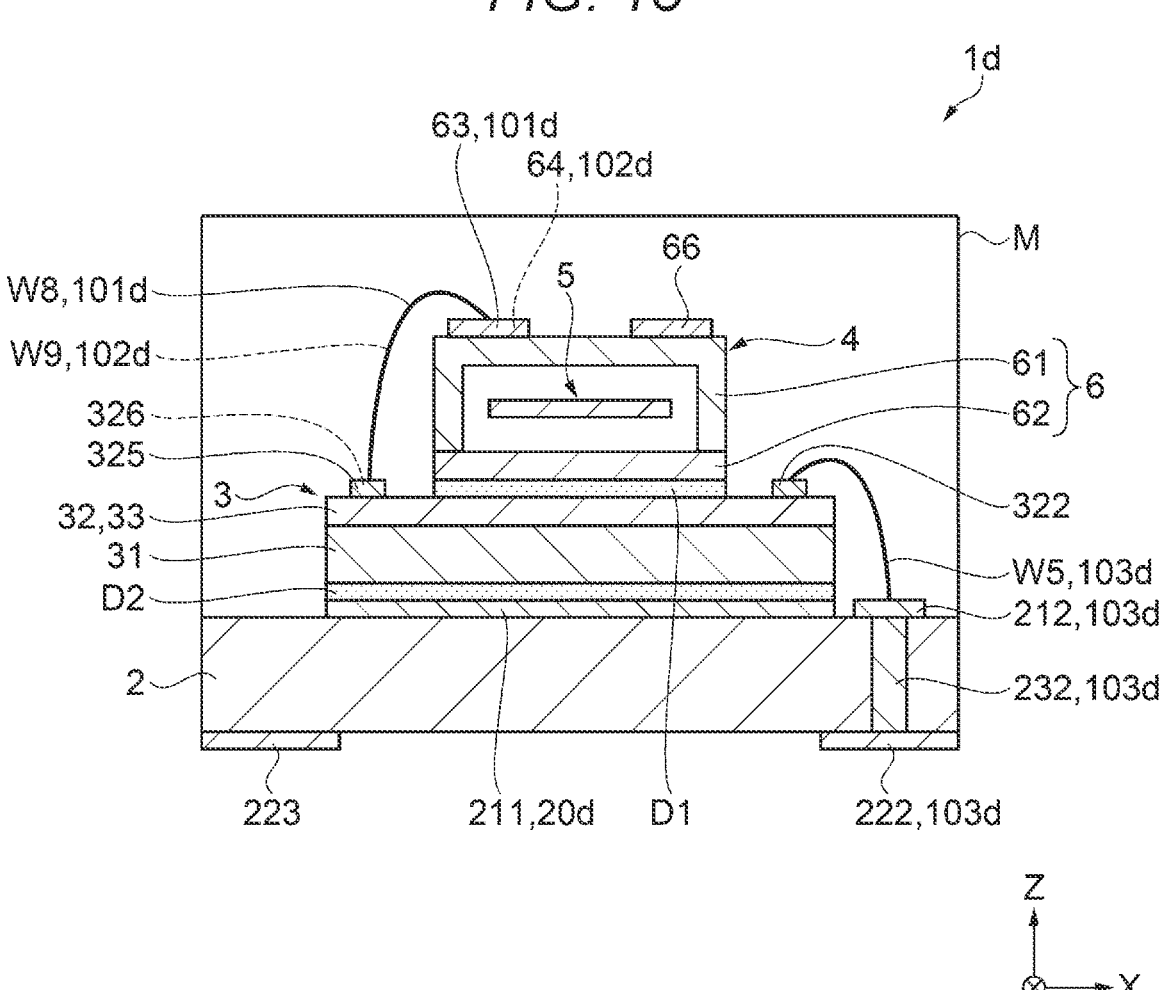
FIG. 13 is a sectional view of a vibrator device according to embodiment 5.

As shown in FIG. 13, in the embodiment, the semiconductor element 3 is placed upside down compared to that in embodiment 1. Specifically, in the embodiment, the circuit unit 32 is placed on the upper surface of the semiconductor substrate 31. The upper surface of the semiconductor element 3 is the upper surface of the circuit unit 32 and the lower surface of the semiconductor element 3 is the lower surface of the semiconductor substrate 31.

The upper surface of the semiconductor element 3 and the lower surface of the vibrator 4 are bonded via the adhesive D1.

The lower surface of the semiconductor element 3 and the upper surface of the base 2 are bonded via an adhesive D2. Specifically, the lower surface of the semiconductor element 3 and the first coupling wire 211 as a shield wire 20*d* placed on the upper surface of the base 2 are bonded via the adhesive D2. The shield wire 20*d* will be described later.

Figure 14:
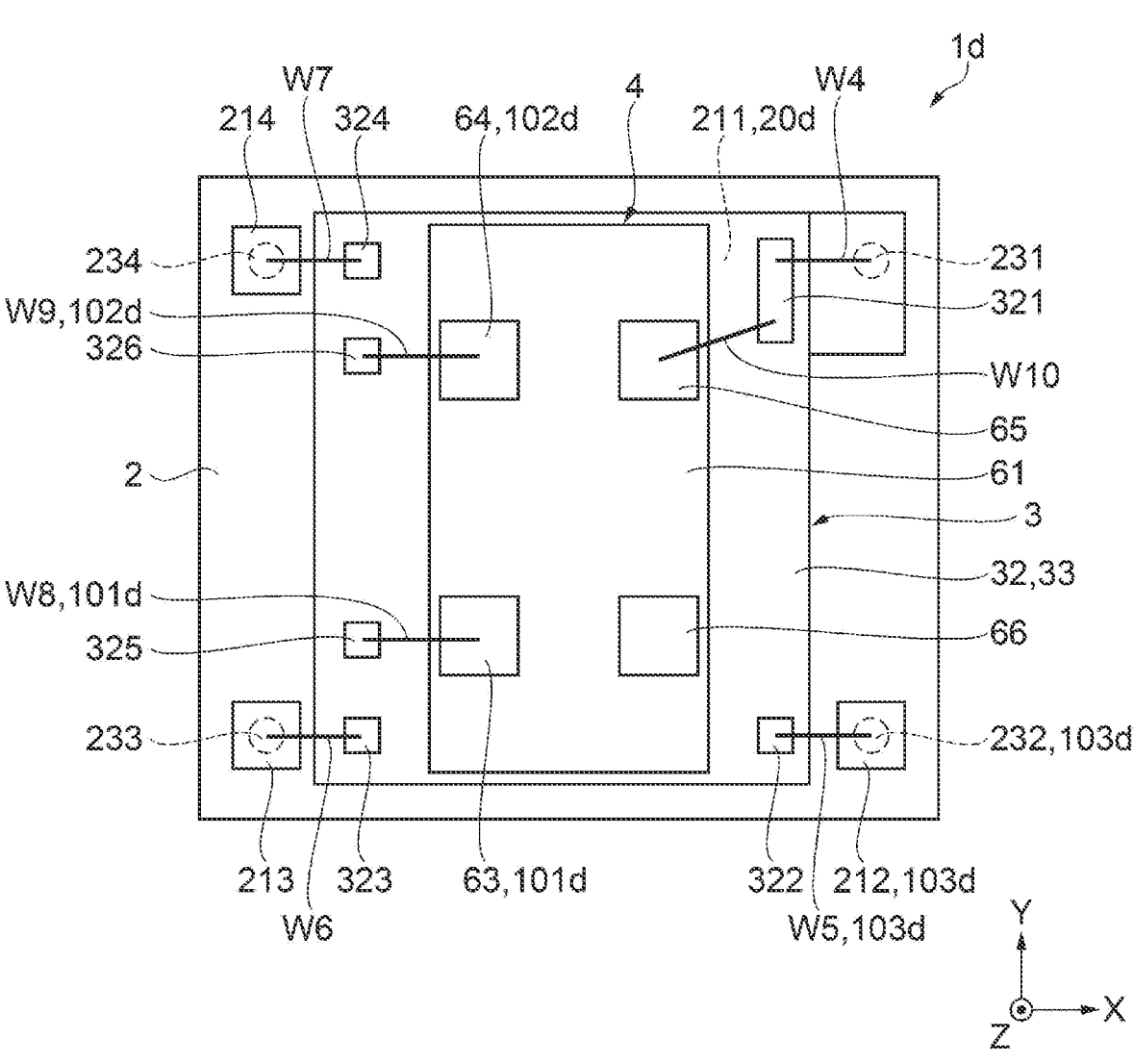
FIG. 14 is a plan view of the vibrator device according to embodiment 5.

As shown in FIGS. 13 and 14, the first coupling terminal 321, the second coupling terminal 322, the third coupling terminal 323, the fourth coupling terminal 324, the fifth coupling terminal 325, and the sixth coupling terminal 326 are placed on the upper surface of the semiconductor element 3.

Figure 15:
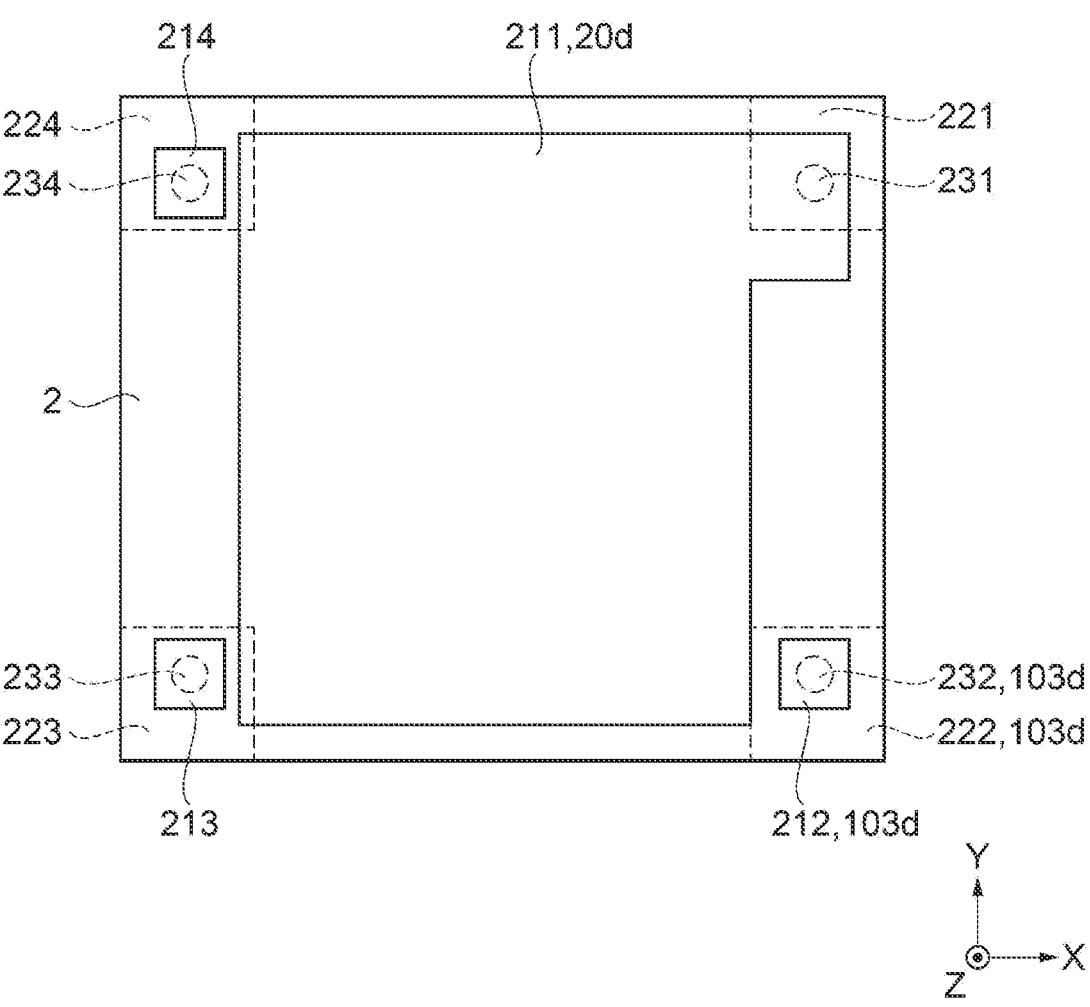
FIG. 15 is a plan view of a base according to embodiment 5.

As shown in FIGS. 14 and 15, the first coupling wire 211, the second coupling wire 212, the third coupling wire 213, and the fourth coupling wire 214 are placed on the upper surface of the base 2.

As shown in FIGS. 13 and 14, the first coupling terminal 321 and the first coupling wire 211 are electrically coupled via the conductive wire W4. The second coupling terminal 322 and the second coupling wire 212 are electrically coupled via a conductive wire W5. The third coupling terminal 323 and the third coupling wire 213 are electrically coupled via a conductive wire W6. The fourth coupling terminal 324 and the fourth coupling wire 214 are electrically coupled via a conductive wire W7.

Further, the fifth coupling terminal 325 placed on the upper surface of the semiconductor element 3 and the first electrode terminal 63 placed on the upper surface of the vibrator 4 are electrically coupled via a conductive wire W8. The sixth coupling terminal 326 placed on the upper surface of the semiconductor element 3 and the second electrode terminal 64 placed on the upper surface of the vibrator 4 are electrically coupled via a conductive wire W9.

Furthermore, the first coupling terminal 321 placed on the upper surface of the semiconductor element 3 and the third electrode terminal 65 placed on the upper surface of the vibrator 4 are electrically coupled via a conductive wire W10.

Next, first wires 101d, 102d, a second wire 103d, and the shield wire 20d of the vibrator device 1d will be explained.

First, the first wires 101d, 102d will be explained.

As shown in FIGS. 13 and 14, in the embodiment, of the first wires 101d, 102d, the first drive wire 101d has the first electrode terminal 63 placed on the upper surface of the vibrator 4 and the wire W8 electrically coupling the first electrode terminal 63 and the fifth coupling wire 325 placed on the upper surface of the semiconductor element 3. Of the first wires 101d, 102d, the second drive wire 102d has the second electrode terminal 64 placed on the upper surface of the vibrator 4 and the wire W9 electrically coupling the second electrode terminal 64 and the sixth coupling wire 326 placed on the upper surface of the semiconductor element 3.

Next, the second wire 103d will be explained.

As shown in FIGS. 13 and 14, in the embodiment, the second wire 103d has the second external terminal 222 placed on the lower surface of the base 2, the second coupling wire 212 placed on the upper surface of the base 2, the via 232 electrically coupling the second external terminal 222 and the second coupling wire 212, and the wire W5 electrically coupling the second coupling wire 212 and the second coupling terminal 322 placed on the upper surface of the semiconductor element 3.

Next, the shield wire 20d will be explained.

In the embodiment, the first coupling wire 211 placed on the upper surface of the base 2 functions as the shield wire 20d.

As shown in FIGS. 14 and 15, the first coupling wire 211 has an area overlapping with the semiconductor element 3 in the plan view. The area has substantially the same shape as the semiconductor element 3 in the plan view. Of the first coupling wire 211, a part overlapping with the semiconductor element 3 in the plan view functions as the shield wire 20d.

As shown in FIG. 13, in the embodiment, for example, the first coupling wire 211 as the shield wire 20d is placed between the first electrode terminal 63 and second electrode terminal 64 of the first wires 101d, 102d and the second external terminal 222 of the second wire 103d. Further, for example, the first coupling wire 211 as the shield wire 20d is placed between the wires W8, W9 of the first wires 101d, 102d and the second external terminal 222 of the second wire 103d.

In other words, the first coupling wire 211 as the shield wire 20d is placed between at least a part of the first wires 101d, 102d and at least a part of the second wire 103d.

As described above, the first coupling wire 211 as the shield wire 20d is placed between at least a part of the first wires 101d, 102d and at least a part of the second wire 103d, and thereby, the difference between the parasitic capacitance between the first drive wire 101d and the second wire 103d and the parasitic capacitance between the second drive wire 102d and the second wire 103d may be reduced. Therefore, the fluctuations of the output frequency relative to the fluctuations of the power supply voltage are smaller and the vibrator device 1d with good frequency-power characteristics may be provided.

As described above, according to the embodiment, even when the semiconductor element 3 and the base 2 are electrically coupled using wire bonding, the first coupling wire 211 as the shield wire 20d is placed between the first wires 101d, 102d and the second wire 103d, and thereby, the same effects as those of embodiment 1 may be obtained.

As above, the vibrator devices 1 to 1d are explained based on embodiments 1 to 5. Note that the present disclosure is not limited to those, but the configurations of the respective parts may be replaced by any configurations having the same functions. Further, any other configuration may be added to the present disclosure. Furthermore, the respective embodiments may be appropriately combined.

For example, the configuration of embodiment 4 may be applied to embodiments 1 to 3.

Further, for example, the shield wires 20 to 20d are coupled to the ground potential, however, not necessarily coupled to the ground potential. The shield wires 20 to 20d may be held at a constant potential fixed to another constant potential than the ground potential.

What is claimed is:

1. A vibrator device having a base, a semiconductor element having an oscillation circuit, and a vibrator having an excitation electrode sequentially stacked, comprising:
  a first wire electrically coupling between the excitation electrode and the semiconductor element;
  a second wire electrically coupling between an external output terminal placed on the base and the semiconductor element; and
  a shield wire placed between at least a part of the first wire and at least a part of the second wire.

2. The vibrator device according to claim 1, wherein the shield wire is placed on the base.

3. The vibrator device according to claim 2, wherein the shield wire is placed on a surface facing the semiconductor element in the base.

4. The vibrator device according to claim 2, wherein the base is a multilayer substrate, and the shield wire is placed between layers of the multilayer substrate.

5. The vibrator device according to claim 4, wherein the shield wire placed between the layers is placed in a first direction and a second direction crossing the first direction in a plan view with respect to the second wire placed between the layers.

6. The vibrator device according to claim 5, wherein the shield wire placed between the layers extends to a side surface of the base.

7. The vibrator device according to claim 4, further comprising a via electrically coupled to the shield wire placed between the layers.

8. The vibrator device according to claim 1, wherein the semiconductor element has a constant potential layer held at a constant potential, and the shield wire is the constant potential layer of the semiconductor element.

9. The vibrator device according to claim 1, wherein the vibrator has a lid and a base member forming a
housing space housing a vibrator element between the
lid and itself, and the shield wire is the lid of the vibrator.

10. The vibrator device according to claim 9, wherein the lid is electrically coupled to the semiconductor ele-
ment via a conductive adhesive.

\* \* \* \* \*